United States Patent
Nakabayashi et al.

(10) Patent No.: US 6,758,607 B2
(45) Date of Patent: Jul. 6, 2004

(54) OPTICAL COMMUNICATION MODULE AND OPTICAL COMMUNICATION MODULE PRODUCT

(75) Inventors: Takashi Nakabayashi, Yokohama (JP); Noriaki Kaida, Yokohama (JP)

(73) Assignee: Sumitomo Electric Industries, Ltd., Osaka (JP)

( * ) Notice: Subject to any disclaimer, the term of this patent is extended or adjusted under 35 U.S.C. 154(b) by 282 days.

(21) Appl. No.: 10/093,831

(22) Filed: Mar. 11, 2002

(65) Prior Publication Data

US 2002/0167017 A1 Nov. 14, 2002

(30) Foreign Application Priority Data

Mar. 9, 2001 (JP) ..................................... P2001-066713
Jan. 31, 2002 (JP) ..................................... P2002-024232

(51) Int. Cl.[7] ............................ G02B 6/12; G02B 6/42; G01J 1/32; H01J 5/02; G01V 5/00
(52) U.S. Cl. ............................ 385/88; 385/14; 385/92; 250/205; 250/239; 250/257
(58) Field of Search .............................. 385/14, 88–94; 250/205, 239

(56) References Cited

U.S. PATENT DOCUMENTS 6,004,046 A * 12/1999 Sawada ........................ 385/92
6,213,650 B1 * 4/2001 Moriyama et al. ............ 385/88
6,244,754 B1 * 6/2001 Takagi et al. .................. 385/88
6,257,773 B1    7/2001 Moriyama et al.
6,385,222 B1 * 5/2002 Aikiyo ..................... 372/38.02

* cited by examiner

Primary Examiner—John D. Lee
Assistant Examiner—Tina M Lin
(74) Attorney, Agent, or Firm—Smith, Gambrell & Russell, LLP

(57) ABSTRACT

A package contains therein a semiconductor laser element for emitting light and a semiconductor circuit element for driving the semiconductor laser element and is provided with an optical fiber supporting face and a back face. The optical fiber supporting face is provided for supporting an optical fiber for transmitting the light from the semiconductor laser element, and the back face is opposed to the optical fiber supporting face. The back face has a lead pin for feeding a positive-phase signal into the semiconductor circuit element and a lead pin for feeding a negative-phase signal into the semiconductor circuit element. The lead pins penetrate through the back face. The semiconductor circuit element receives positive-phase and complementary negative-phase signals, both including a high-frequency component of 10 GHz or higher, through the lead pins, converts these signals into a single-ended signal, and outputs the resulting signal to the semiconductor laser element.

20 Claims, 15 Drawing Sheets

OPTICAL COMMUNICATION MODULE AND OPTICAL COMMUNICATION MODULE PRODUCT

BACKGROUND OF THE INVENTION

1. Field of the Invention

The present invention relates to an optical communication module and an optical communication module product.

2. Related Background Art

An optical communication module comprises a semiconductor laser; an optical fiber for receiving light from the semiconductor laser; a light-receiving device for monitoring light from the semiconductor laser; and a package for containing the light-receiving device, semiconductor laser, and optical fiber therein.

SUMMARY OF THE INVENTION

FIG. 16 is a perspective view showing the configuration of an optical transmission module 90 for technical studies. The optical transmission module 90 is used as a light source in optical communications. The inventors have studied a configuration of an optical transmission module in which a coaxial connector 91b of SMA type, GPO type, or the like is provided on a side face of a butterfly type package 92 in order to transmit positive-phase and complementary negative-phase signals, both including a high-frequency component of 2.5 GHz or higher, from the outside to inside of the package, thereby attaining impedance matching for the positive- and negative-phase signals. As shown in FIG. 16, such an optical transmission module has the single coaxial connector 91b on a package side orthogonal to an optical fiber supporting face 93 supporting an optical fiber 94. Due to restrictions on dimensions of the coaxial connector 91b itself, the coaxial connector 91b can not be provided on a package side opposed to the optical fiber supporting face 93. Further, mounting the optical transmission module with a pair of coaxial connectors makes it necessary to increase the size of the optical transmission module.

FIG. 17 is a view showing a configuration of the optical transmission module 90 mounting a circuit board 95 thereon. The circuit board 95 is mainly constituted by the optical transmission module 90 comprising the coaxial connector 91b, and an electric circuit unit 96 including an electric device 98 and a coaxial connector 91a. The electric circuit unit 96 controls the optical transmission module 90. The optical transmission module 90 is connected via a coaxial cable 97 to the electric circuit unit 96 of the circuit board 95 in order to feed positive-phase and negative-phase signals both including a high-frequency component of 2.5 GHz or higher into the optical transmission module 90. The coaxial cable 97 connects the coaxial connectors 91a and 91b to each other. In optical transmission module 90, the optical fiber supporting face 93 is provided with the optical fiber 94 through which light emitted from the optical transmission module 90 propagates. In the optical transmission module 90, the optical fiber 94 is positioned at the optical fiber supporting face 93, and it is necessary that the optical fiber supporting face 93 be provided so as to face one side 95a of the circuit board 95. For obtaining flexibility in designing the circuit board 95, it is necessary that the electric circuit unit 96 be provided to face another side 95b of the circuit board 95 opposed to the side 95a. The coaxial cable 97 connects the coaxial connector 91a provided in the electric circuit unit 96 and the coaxial connector 91b provided in the optical transmission module 90 to each other, and is disposed in a mounting surface of the circuit board 95 so as to extend along a smooth curve to eliminate the deterioration of high-frequency signals propagating through the coaxial cable 97. For this connection, the coaxial cable 97 is required to have a length of at least 4 to 5 cm. The inventors have found that the coaxial cable 97 further necessitates the mounting portion therefor and that this mounting portion limits the reduction of the circuit board 95 in size.

The inventors think that dimensions of the coaxial connector 91b impose limitations on the reduction of height in the optical transmission module 90. The inventors also think that it is necessary to reduce the size of the optical transmission module 90, the package of the optical transmission module 90 in particular, in response to meeting recent demands for small-sized optical transmission apparatuses.

The inventors also think that there are demands for optical transmission modules capable of high-speed operations. Recently, optical transmission modules are required to operate to receive a driving signal including a frequency component of 10 GHz or higher, for example.

It is an object of the present invention to provide an optical transmission module operable to receive a positive-phase signal and a complementary negative-phase signal both including a high-frequency component of 10 GHz or higher, and to provide an optical communication module product including a circuit board implemented with this optical transmission module.

One aspect of the present invention relates to an optical transmission module. The optical transmission module comprises a semiconductor laser element, a semiconductor circuit element, and a package. The semiconductor laser element emits light. The semiconductor circuit element drives the semiconductor laser element, receives a positive-phase signal and a complementary signal both including a high-frequency component, converts thus received signals into a single-ended signal, and provides thus obtained single-ended signal to the semiconductor laser element. The package contains the semiconductor laser element and semiconductor circuit element therein and comprises an optical fiber supporting face supporting an optical fiber thereon for transmitting light emitted from the semiconductor laser element. The optical transmission module comprises a lead pin for receiving the positive-phase signal and a lead pin for receiving the negative-phase signal on a back face, opposed to the optical fiber supporting face, of the package. These lead pins are provided so as to pass through the back face.

Another aspect of the present invention relates to an optical communication module. The optical communication module comprises a housing, a semiconductor light-emitting element, and a semiconductor element. The housing has first to fourth walls. The first wall is provided with an optical fiber accommodating portion extending in a predetermined axial direction. Each of the second and third walls extends in the predetermined axial direction and has a plurality of lead terminals thereon. The fourth wall is provided to be opposes to the first wall, and has a plurality of lead terminals. The semiconductor element has a first group of input terminals, an output terminal, and a second group of a plurality of terminals. The input terminals in the first group receive signals for differential operation to drive the semiconductor light-emitting element. The output terminal provides a driving signal from the signals for differential operation. The terminals in the second group are provided to be separated from the input and output terminals. In the semiconductor element, the terminals in the second group are connected to the lead terminals on the second and third walls. The semiconductor light-emitting element is connected to the semiconductor device.

Still another aspect of the present invention relates to an optical communication module product. The optical communication module product comprises an optical communication module, an electronic component, and a substrate. The electronic component generates signals for differential operation to drive the semiconductor light-emitting element. The substrate comprises a wiring member and a mounting member. The wiring member has a wiring layer for connecting the electronic component to the first and second lead terminals of the optical communication module. The mounting member mounts the optical communication module, electronic component, and wiring member. The wiring member has an opening capable of receiving the optical communication module therein. The opening has a side provided to face the fourth wall.

The above-mentioned object and other objects, features, and advantages of the present invention will more easily be seen from the following detailed description of preferred embodiments of the present invention set forth with reference to the accompanying drawings.

DETAILED DESCRIPTION OF THE PREFERRED EMBODIMENTS

The findings of the present invention can easily be seen in view of the following detailed description with reference to the accompanying drawings illustrated by way of example. Embodiments concerning the optical communication module in accordance with the present invention will now be explained with reference to the accompanying drawings. When possible, parts identical to each other will be referred to with the same numerals.

First Embodiment

Figure 1:
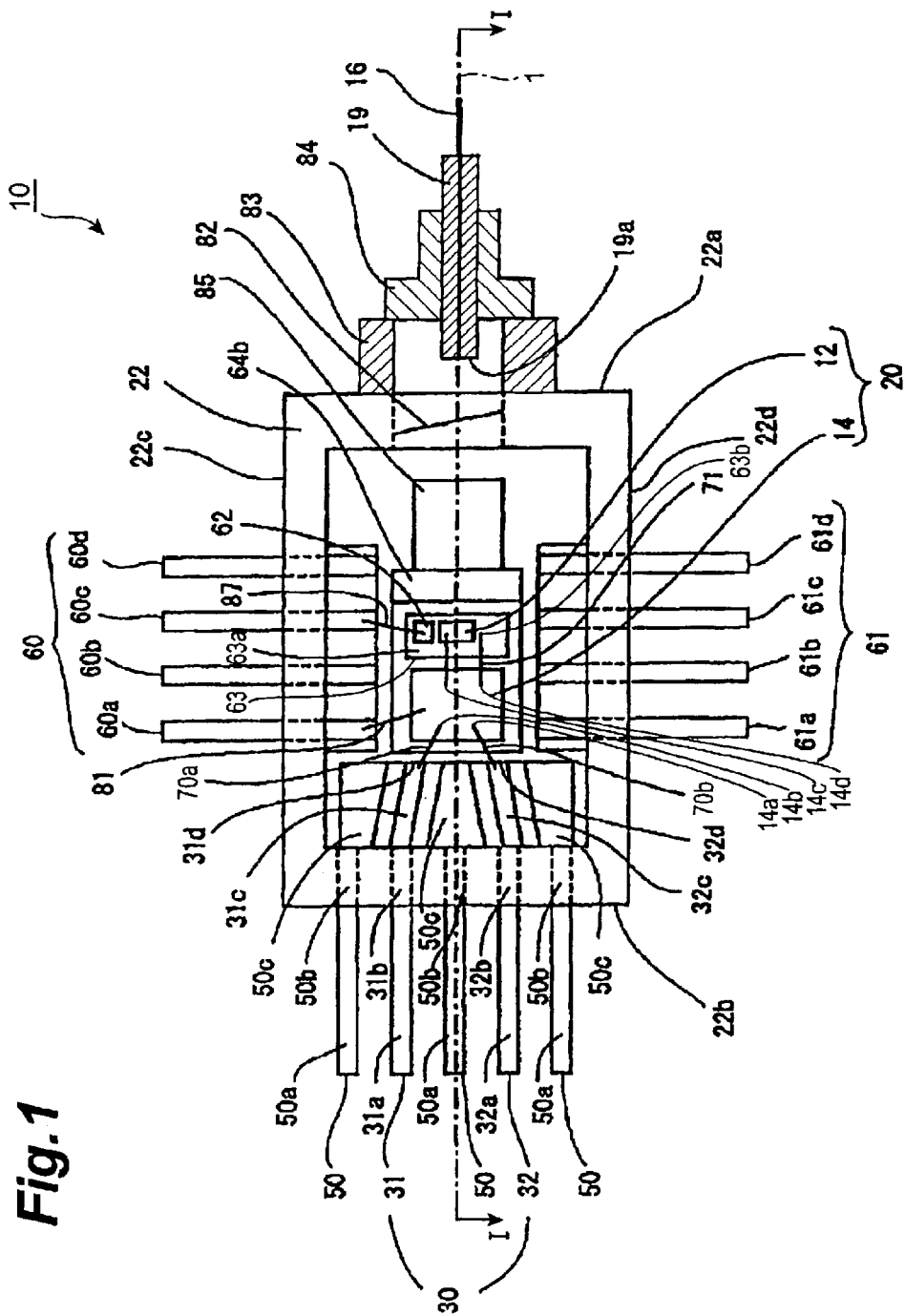
FIG. 1 is a plan view of the optical transmission module in accordance with an embodiment of the present invention.
Figure 2:
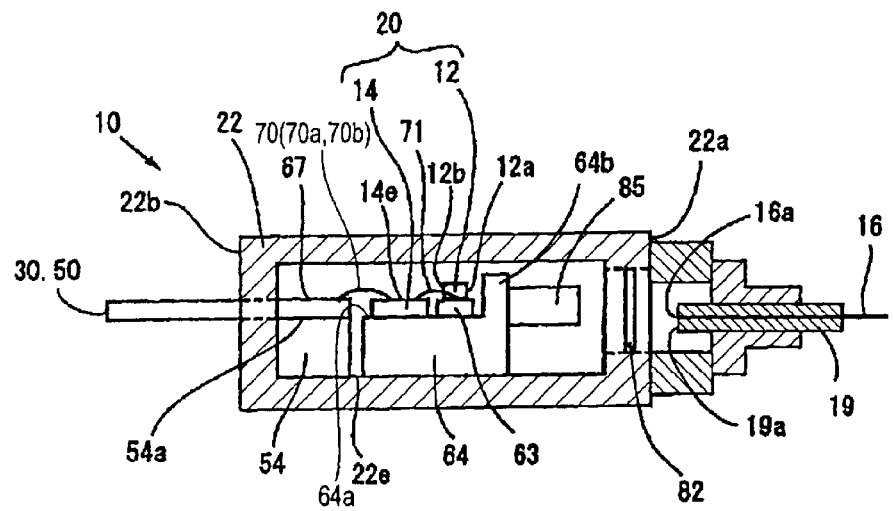
FIG. 2 is a sectional view, taken along the line I—I shown in FIG. 1, showing the optical transmission module in accordance with the above-mentioned embodiment of the present invention.
Figure 3:
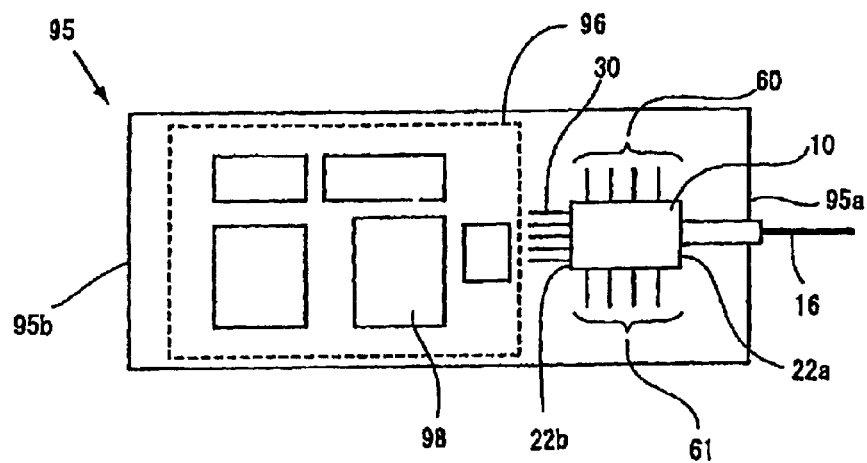
FIG. 3 is a schematic view of a circuit board implemented with the optical transmission module of the present invention.

FIG. 1 is a plan view showing an optical transmission module 10 in accordance with an embodiment, and FIG. 2 is a sectional view showing the optical transmission module taken along the line I—I in FIG. 1. FIG. 3 is a schematic diagram showing a circuit board mounted with the optical transmission module in accordance with the embodiment. The optical transmission module is used as a light source in optical communications, and has high-frequency signal input terminals.

Referring to FIGS. 1 and 2, the optical transmission module 10 comprises a semiconductor device assembly 20 disposed within a package 22, whereas the semiconductor element assembly 20 includes a semiconductor laser element 12 for emitting light and a semiconductor circuit element 14 for driving the semiconductor laser element 12. In the optical transmission module 10, an optical fiber 16 is supported by an optical fiber supporting face 22a of the package 22. Light emitted by the semiconductor laser element 12 is incident on the optical fiber 16. The optical transmission module 10 comprises a plurality of lead pins 30 for receiving a positive-phase signal and a complementary negative-phase signal, both signals including a high-frequency component of 10 GHz or higher. These lead pins 30 are provided at aback face 22b, opposes to the optical fiber supporting face 22a, of the package 22.

As shown in FIG. 3, the optical transmission module 10 is not required to have a coaxial cable for feeding positive-phase and complementary negative-phase signals from the circuit board 95 thereinto. The optical transmission module 10 of this configuration does not require an area on the circuit board for disposing the coaxial cable. The configuration allows the circuit board to become smaller.

In addition, the optical transmission module 10 uses a pair of lead pins 30 as input terminals for receiving a positive-phase signal and a complementary negative-phase signal, both signals including a high-frequency component of 10 GHz or higher. The optical transmission module 10 receives the positive-phase signal and negative-phase signal by way of a pair of lead pins 30. Since the lead pins 30 are used instead of a single coaxial connector, the lead pins 30 can be provided even on a side face, having a small area, of the package 22, such as the back face 22b. In designing the circuit board 95 equipped with the optical transmission module 10, a high degree of the design flexibility will be provided.

Further, the optical transmission module 10 in FIGS. 1 and 2 comprises lead pins 30 as input terminals, instead of coaxial connectors, for receiving the positive-phase signal and the complementary negative-phase signal both including a high-frequency component of 10 GHz or higher, and thus the height of the package 22 is not restricted by dimensions of coaxial connectors, whereby the height of the optical transmission module can be smaller. The package 22 comprises a first side face 22a and a second side face 22d which extend in a direction of a predetermined axis 1, the optical fiber supporting face 22a intersecting with the predetermined axis 1 at right angles, and the back face 22b opposed to the optical fiber supporting face 22a. The optical fiber supporting face 22a holds one end portion of the optical fiber.

The lead pins receive positive- and negative-phase signals. As a lead terminal for receiving the positive-phase signal, a positive lead pin 31 is prepared. As a lead terminal for receiving the negative-phase signal, a negative lead pin 32 is prepared. The positive lead pin 31 and the negative lead pin 32 are disposed to extend along a reference plane parallel to the bottom face 22e of the package 22 and intersect with the back face 22b at substantially right angles. The positive lead pin 31 and negative lead pin 32 pass through the back face 22b of the package so as to extend from the outside to inside of the package.

Further, the positive lead pin 31 is constituted by a positive outer lead portion 31a working as an input terminal on the outside of the package, a positive penetrating lead portion 31b passing through the back face 22b of the package (the side wall of the package), and a positive inner lead portion 31c in the inside of the package. The negative lead pin 32 is constituted by a negative outer lead portion 32a, a negative penetrating lead portion 32b, and a negative inner lead portion 32c.

The back face 22b of the package 22 is provided with a number of grounding lead pins 50, each of the positive lead pin 31 and negative lead pin 32 are provided between these grounding lead pins 50. The grounding lead pins 50 are provided so as to extend along the reference plane and so as to pass through the back face 22b at substantially right angles. The grounding lead pins 50 also pass through the back face 22b of the package so as to extend from the outside to inside of the package.

Each of the grounding lead pins 50 is constituted by an outer lead portion (grounding outer conductor) 50a outside the package, a penetrating lead portion (grounding penetrating conductor) 50b passing through the back face 22b of the package 22, and an inner lead portion (grounding inner conductor) 50c inside the package.

The positive outer lead portion 31a, negative outer lead portion 32a, and grounding outer lead portion 50a are provided such that each of their respective lengths is substantially equal to the other and such that each of their respective sectional forms is substantially identical to the other. The grounding outer lead portion 50a, positive outer lead portion 31a, grounding outer lead portion 50a, negative outer lead portion 32a, and grounding outer lead portion 50a are arranged in this order on a reference plane extending parallel to the package bottom face 22e.

The above-mentioned arrangement of the leads can restrain the positive-phase signal on the positive outer lead pin 31a and the negative-phase signal on the negative outer lead pin 32a from interfering with each other even when the optical communication module 10 receives positive-phase and complementary negative-phase signals including a high-frequency component of 10 GHz or higher at these outer lead pins. The difference between the impedance of the positive outer lead pin 31a and the impedance of the negative outer lead pin 32a can also be reduced to achieve the impedance matching therebetween.

In the back face 22b of the package 22, the surroundings of the positive penetrating lead pin portion 31b, negative penetrating lead pin portion 32b, grounding penetrating lead portions 50b are covered with electrically insulating material. This coverage prevents the positive-phase signal on the positive penetrating lead portion 31b and the negative-phase signal on the negative penetrating lead portion 32b from interfering with each other, and reduces the difference between the impedance of the positive outer lead pin 31a and the impedance of the negative outer lead pin 32a to achieve the impedance matching therebetween.

As will be explained in detail in the following, each of the positive lead pin 31, negative lead pin 32, and grounding lead pins 50 has a structure of coplanar type transmission lines within the package 22.

The positive inner lead portion 31c, negative inner lead portion 32c, and grounding inner lead portions (grounding inner conductors) 50c are mounted on the upper face 54a of an inner substrate 54 made of dielectric material.

Each of the positive inner lead portion 31c and the negative inner lead portion 32c has a stripe form and extend linearly. The positive inner lead pin 31c and the negative inner lead pin 32c are also provided such that their lengths and their sectional forms (on a plane orthogonal to the extending direction thereof) are identical to each other.

Each of the positive inner lead portion 31c and negative inner lead portion 32c is provided between grounding inner lead portions (grounding inner conductors) 50c. The positive inner lead portion 31c and negative inner lead portion 32c are provided on the upper face 54a of the inner substrate 54 and is distanced from the grounding lead portions (grounding inner conductors) 50c, whereas the grounding lead portions 50c are provided so as to cover the remaining portion of the upper face 54a of the inner substrate 54.

Therefore, even for the positive-phase signal including a frequency component of 10 GHz or higher and the negative-phase signal, the positive-phase signal on the positive inner lead portion 31c and the negative-phase signal on the negative inner lead portion 32c can be restrained from interfering with each other, and reduce the difference between the impedance of the positive inner lead pin 31c and the impedance of the negative inner lead pin 32c to obtain the impedance matching therebetween.

The height of the upper face 54a of the inner substrate 54 from the package bottom face 22e is positioned to the height of the positive lead pin 31 and negative lead pin 32, and is determined in this embodiment such that the positive lead pin 31 and negative lead pin 32 can extend substantially perpendicular to the back face 22e.

The first side face 22c and second side face 22d of the package are provided with a plurality of lead pins such as first lead pins 60 and second lead pins 61. These lead pins 60 and 61 are provided so as to pass through the first side face 22c or second side face 22d from the outside to inside of the package, and are used for the input and/or output of powers and signals different from the high-frequency positive-phase and the high-frequency negative-phase signals.

The height of the first lead pins 60 and second lead pins 61 from the package bottom face 22e is determined so as to become substantially equal to the height of the positive lead pin 31, negative lead pin 32, and grounding lead pins 50, provided in the back face 22b, from the package bottom face 22e. The first lead pins 60 and second lead pins 61 are provided so as to extend along a reference plane substantially parallel to the package bottom face 22e.

The first lead pins 60 and second lead pins 61 are used as terminals, such as signal input/output terminals for a light-receiving element and a temperature detecting element 62 which will be explained later, and bias current supply terminals for the semiconductor circuit element 14.

The semiconductor element assembly further comprises a mounting member 64, which has a mounting face 64a for mounting the semiconductor circuit element 14 and semiconductor laser element 12, and a lens supporting portion 64b. The lens supporting portion 64b extends substantially perpendicular to the mounting face 64a.

The inner substrate 54, semiconductor circuit element 14, and semiconductor laser element 12 are arranged in a direction of the predetermined axis 1 in this order. The semiconductor circuit element 14 and semiconductor laser element 12 are mounted on the mounting face 64a so as to be separated from each other by a small distance, and are secured to the mounting member 64 provided on the package bottom face 22e.

The semiconductor laser element 12 is secured to the mounting member 64 by way of a chip mounting part 63, such as a chip carrier. The semiconductor laser element 12 and optical fiber 16 are positioned to each other such that light emitted from the semiconductor laser element 12 is incident on the optical fiber 16.

For electrically connecting the positive inner lead pin 31c and negative inner lead pin 32c to the semiconductor circuit element 14, the inner substrate 54 is disposed such that the distance between the package bottom face 22e and the upper face 67 of the positive inner lead portion 31c and negative inner lead portion 32c is substantially equal to the distance between the package bottom face 22e and wiring pads 14a and 14b on the upper face 14e of the semiconductor circuit element 14. The wiring pads 14a and 14b are provided so as to receive the positive-phase and negative-phase signals.

The positive inner lead pin end 31d and the negative inner lead pin end 32d are electrically connected, by way of bonding wires 70a and 70b, to the wiring pads 14a and 14b provided in the semiconductor circuit element 14, respectively, whereas the bonding wires 70a and 70b are provided such that their lengths and sectional forms are substantially identical to each other.

Disposed on the upper face 63a of the chip mounting part 63 is a wiring pad 63b acting as an input portion, electrically connected to the semiconductor laser element 12, for receiving a high-frequency signal to the semiconductor laser element 12. The chip mounting part 63 is provided such that the distance between the package bottom face 22e and the wiring pads 14c and 14d disposed on upper face 14e of the semiconductor element is substantially equak to the distance between the package bottom face 22e and the wiring pad 63b.

The positive inner lead pin end 31d, negative inner lead pin end 32d, semiconductor circuit element 14, and chip mounting part 63 are arranged in a direction of the predetermined axis 1. The inner substrate 54 and semiconductor circuit element 14 are arranged such that the positive inner lead pin end 31d and negative inner lead pin end 32d face one side of the semiconductor circuit element 14. The semiconductor circuit element 14 and the chip mounting part 63 mounted with the semiconductor laser element 12 are arranged such that the chip mounting part 63 is faced to one side of the semiconductor circuit element 14. These arrangements allow the lengths of bonding wires 70a, 70b and 70c to be shorter, the bonding wire 70a connects the positive inner lead pin end 31d and the semiconductor circuit element 14 to each other, the bonding wire 70b connects the negative inner lead pin end 32d and the semiconductor circuit element 14 to each other, and a bonding wire 71 connects the semiconductor circuit element 14 and the chip mounting part 63 to each other.

As mentioned above, the positive lead pin 31 and negative lead pin 32 in the optical transmission module 10 are prepared to obtain the impedance matching to each other with respect to the positive-phase signal and negative-phase signal including a high-frequency component of 10 GHz or higher. The bonding wires 70a, 70b, and 71 are provided to have their short lengths and sectional forms identical to each other, and this preparation prevents the deterioration of the signal transmission due to impedance mismatching, thereby stably operating the optical transmission module 10.

The semiconductor laser element 12 has a first face 12a and a second face 12b, the second face 12b being opposed to the first exit face 12a.

Figure 4:
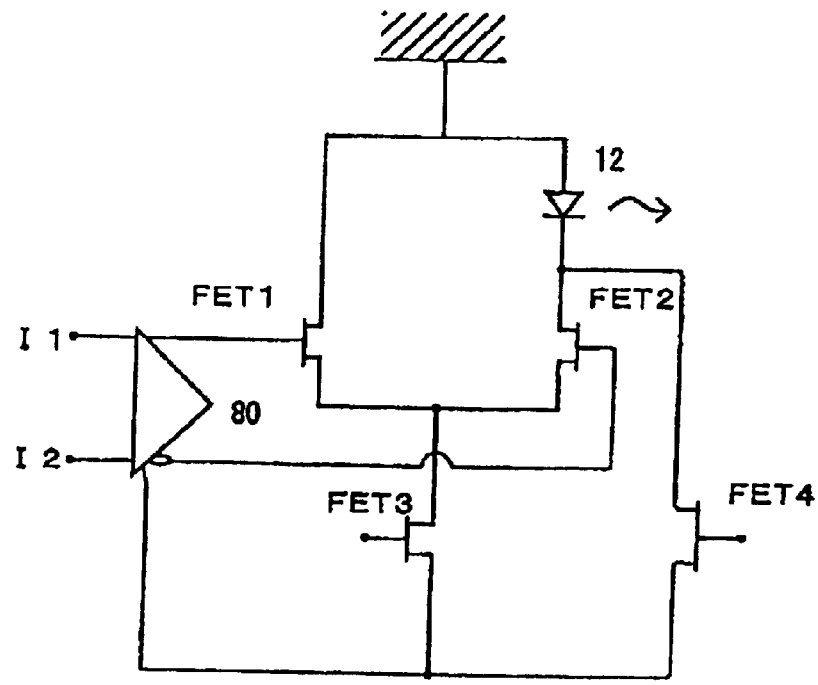
FIG. 4 is a circuit diagram of the semiconductor circuit element in accordance with an embodiment of the present invention.

As shown in FIG. 4, the semiconductor circuit element 14 comprises an amplifier 80 for amplifying a positive-phase signal fed from an input terminal I1 and a negative-phase signal fed from an input terminal I2, and for outputting a pair of amplified signals, and comprises a differential amplifier for receiving the pair of signals from the amplifier 80. The differential amplifier includes an FET1 having a gate for receiving the positive-phase signal amplified by the amplifier 80, and an FET2 having a gate for receiving the negative-phase signal amplified by the amplifier 80, whereas the respective sources of the FET1 and FET2 are connected to each other to form a common source node. A modulation current controlling FET3 is connected to the common source node, and controls the total amount of respective currents flowing through the FET1 and FET2. According to the foregoing configuration, the FET1 provides the positive-phase signal at the drain thereof, whereas the FET2 provides the negative-phase signal at the drain thereof. Provided between the drain of the FET2 and the source of the modulation current control FET3 is a bias current control FET4 for providing the semiconductor laser element 12 with a bias current (DC current) in addition to the above-mentioned positive- and negative-phase signals. The bias current control FET4 provides the semiconductor laser element with a current for biasing a threshold current around which the modulation current for the semiconductor laser element is changed. By providing the bias current, the turn-on/off (emission/extinction) of the semiconductor laser is controlled only with the positive- and negative-phase signals. More specifically, the anode of the semiconductor laser element is provided with the grounding potential, and the semiconductor laser element emits light when the cathode potential becomes negative. The bias current is supplied by way of a bonding wire 81 and the first lead pin 60a provided in the first side face (referred to with numeral 22c in FIG. 1). The bonding wire 81 connects the first lead pin 60a to the semiconductor circuit element. These circuits are arranged between a first reference potential line, such as a grounding line, and a second reference potential line, such as a power line.

In FIGS. 1 and 2, the optical fiber 16 has one end 16a and the other end opposite from the one end 16a. The one end 16a of the optical fiber is inserted in a ferrule 19. The other end of the optical fiber 16 is provided with an optical coupling device.

A light-transmitting plate 82, a guide 83, and a sleeve 84 is provided on the fiber supporting face 22a of the package 22. The light-transmitting plate 82 can transmit therethrough the light emitted from the semiconductor laser element 12. The guide 83 has a cylindrical form and is positioned to the light-transmitting plate 82. The sleeve 84 is used to secure the ferrule 19 to the guide 83. The ferrule 19 is disposed at one end portion 16a of the optical fiber.

The ferrule 19 is secured to the guide 83 at a connecting portion, such as a welding portion, by way of the sleeve 84. In the optical transmission module 10, one end 19a of the ferrule 19 is inserted into the guide 83 and is positioned to obtain the maximum coupling between the optical fiber and the first face 12a of the semiconductor laser element 12.

The optical transmission module 10 may further comprise a light-receiving element, a temperature detecting element 62, such as thermistor, and a condenser lens unit 85 including a condenser lens.

The light-receiving element is provided on the upper face 64a of the mounting member 64 or the upper face 54a of the inner substrate 54 between the second face 12b and the back face 22b so as receive light emitted from the second exit face 12b of the semiconductor laser element. The light-receiving element detects the light from the second exit face 12b of the semiconductor laser element 12 and converts the received light signal into an electric signal. The resulting electric signal is supplied to second lead pins 61a, 61b in the second side face 22d of the package by way of bonding wires connecting the second lead pins 61a, 61b to the light-receiving element, and is provided to the outside of the package through the second lead pins 61a, 61b.

The temperature detecting element 62, such as a thermistor, is disposed near the semiconductor laser element 12. The electric detection signal from the temperature detecting element 62 is supplied to a first lead pin 60c in the first side face 22c of the package by way of a bonding wire 86 connecting the first lead pin 60c to the temperature detecting element 62, and is provided to the outside of the package by way of the first lead pin 60c in the first side face 22c.

The condenser lens unit 85 is secured to the lens supporting portion 64b of the mounting member 64 such that light from the semiconductor laser element 12a is incident on the optical fiber end 16a.

The semiconductor laser module 10 can receive differential input signals composed of a positive-phase signal and a negative-phase signal, both including a frequency component of 10 GHz or higher, at the positive lead pin 31 and negative lead pin 32.

Although the positive- and negative-phase signals include a high-frequency component of 10 GHz or higher, the semiconductor laser module 10 can improve immunity to electromagnetic disturbances, such as electromagnetic noise coming from the outside of the package. This improvement allows the optical transmission module to operate more stable.

As explained in detail in the foregoing, the optical transmission module can receive positive- and negative-phase signals by way of lead pins. Consequently, the optical transmission module needs no coaxial cable for receiving a positive-phase signal and a complementary signal from the circuit board both including a high-frequency component of 10 GHz or higher, and needs no area on the circuit board for a coaxial cable, whereby the circuit board can be made smaller.

Further, in the optical transmission module, both lead pins for receiving a positive-phase signal and a negative-phase signal are provided on the back face. This structure does not lower design flexibility in designing the circuit board mounting the optical transmission module.

Also, the optical transmission module uses lead pins as input terminals for the positive-phase signal and the negative-phase signal both including a high-frequency component of 10 GHz or higher, and these lead pins can be provided on a plane parallel to the package bottom face. As a consequence, the height of the package is not restricted by dimensions of coaxial connectors, thereby decreasing the height of the optical transmission module.

Further, the optical transmission module can avoid the deterioration of signal transmission due to impedance mismatching, thereby realizing its stable operation. This stable operation is provided because the impedance of the positive lead pin matches that of the negative lead pin with respect to signals including a high-frequency component of 10 GHz or higher, and because each of the bonding wires 70a, 70b, and 71 has its shorter length and has its length and sectional form identical to the other.

Therefore, in an optical transmission module receiving a positive-phase signal and a negative-phase signal both including a high-frequency component of 10 GHz or higher, the optical transmission module can be provided small-sized and is used to form a circuit board implemented with this optical transmission module, and the circuit board can be made smaller without reducing design flexibility in designing the circuit board.

Second Embodiment

Figure 5:
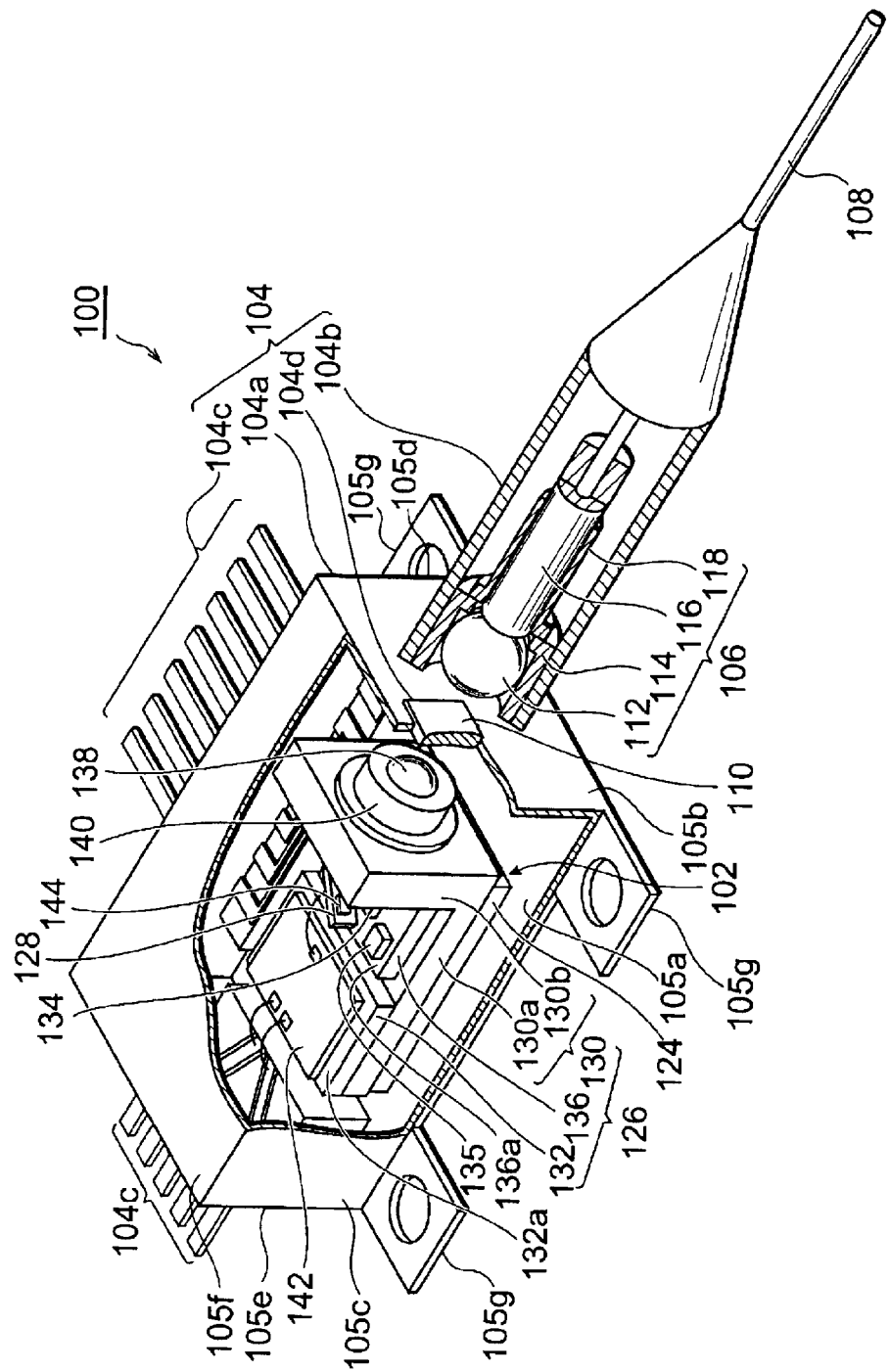
FIG. 5 is a perspective view showing an optical communication module.
Figure 6:
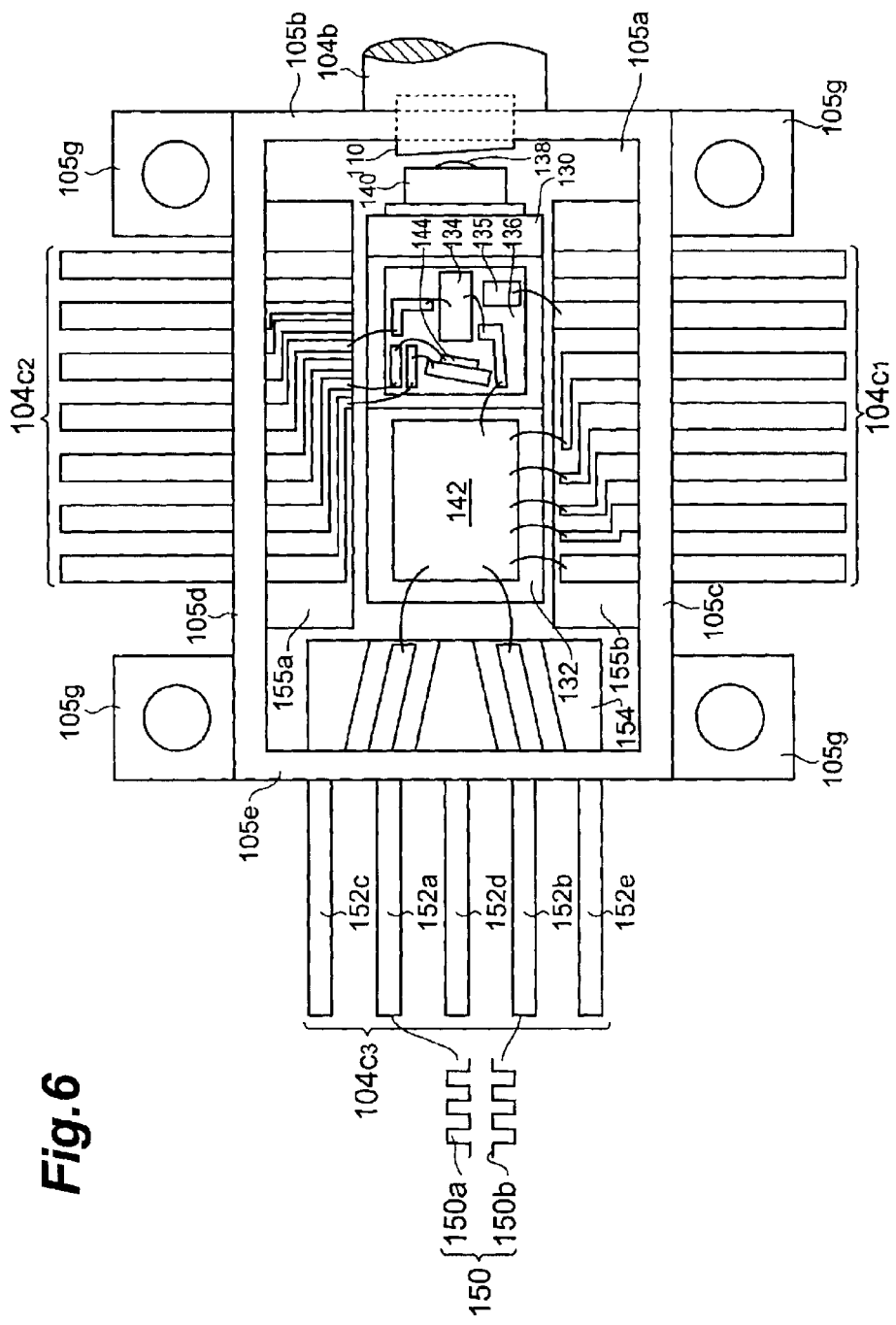
FIG. 6 is a perspective view showing the inner structure of the optical communication module.
Figure 7:
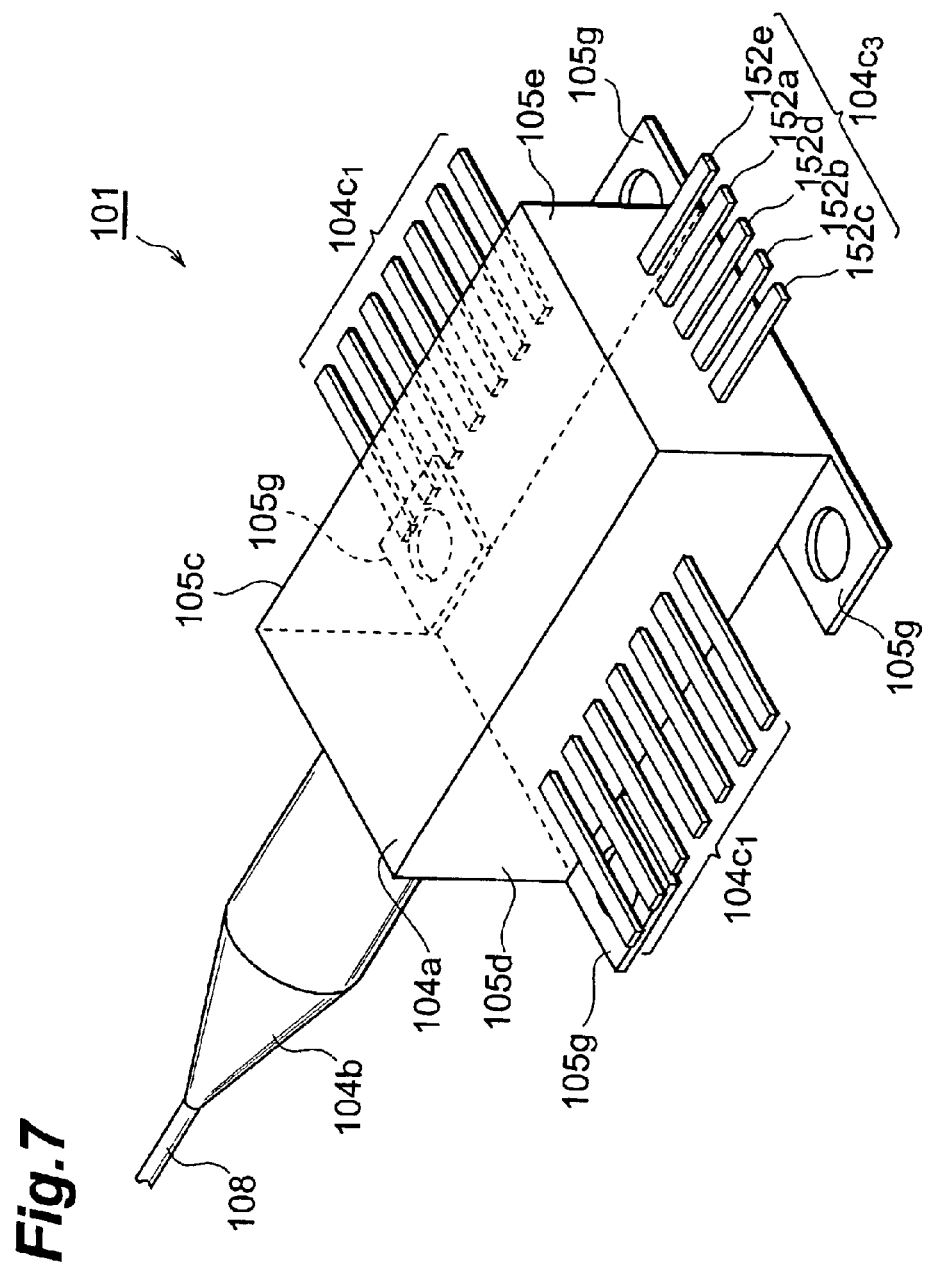
FIG. 7 is a perspective view showing the exterior of the optical communication module.

FIG. 5 is a perspective view showing an optical communication module. FIG. 6 is a plan view showing the inner structure of the optical communication module. FIG. 7 is a perspective view showing the exterior of the optical communication module.

Referring to FIG. 5, this optical communication module 100 comprises an optical communication module main portion 102, a housing 104, an optical coupling portion 106, and an optical fiber 108. The optical module main portion 102 is provided within the housing 104, and generates signal light. A butterfly type package is used as the housing 104, by way of example. The housing 104 has an accommodating portion 104a, an optical fiber supporting portion 104b, lead terminals 104c, and a light-transmitting hole 104d. The accommodating portion 104a defines an accommodating region for accommodating the optical module main portion 102. The accommodating portion 104a is constituted by a bottom 105a, a first wall 105b, a second wall 105c, a third wall 105d, a fourth wall 105e, a lid 105f, and flanges 105g. The optical fiber supporting portion 104b is disposed on the front wall 105b of the accommodating portion 104a, and supports the optical fiber 108 such that the optical fiber 108 is optically coupled with the optical module main portion 102. The lead terminals 104c are provided on the side walls 105c and 105d and back wall 105b of the accommodating portion 104a, and are electrically connected to the optical module main portion 102. The light-transmitting hole 104d is provided on the front wall 105b of the accommodating portion 104a. Light from the optical module main portion 102a passes through the light-transmitting hole 104d to the optical fiber supporting part 104b. A hermetic glass plate 110 is disposed at the light-transmitting hole 104d to form the hermetic sealing of the accommodating region.

The optical coupling portion 106 includes a lens 112, a lens holder 114, a ferrule 116, and a ferrule holder 118. The optical coupling portion 106 is disposed at the optical fiber supporting portion 104b. The lens holder 114 is disposed at the optical fiber supporting portion 104b. The ferrule holder 116 is secured to the lens holder 114. The ferrule holder 116 contains therein the ferrule 116 for holding the optical fiber 108. The lens holder 114 holds the lens 112 provided so as to optically couple the optical module main portion 102 to one end of the optical fiber 108. This configuration provides the optical fiber 108 with light from the optical module main portion 102.

A lens holding member 140 holding a lens 138 is secured to a lens holding portion 130. The lens 138 is provided so as to receive light from a semiconductor light-emitting element 34, and so as to provide one end of the optical fiber 108 with light from the output of the semiconductor light-emitting device 134 by way of the lens 112.

With reference to FIG. 5, the structure of the optical module main portion 102 will now be explained in detail. The optical module main portion 102 generates light modulated in response to an electric signal received by way of a lead terminal of the optical communication module 100.

The optical module main portion 102 has a thermoelectronic cooling element, such as a Peltier element 124, mounted onto the bottom 105a. The Peltier element 124 is utilized for adjusting the temperature of the semiconductor light-emitting element 134. A mounting part 126 is provided on the Peltier element 124. The mounting part 126 is mounted with various optical and electronic elements and components. The mounting part 126 includes mounting members 130, 132, 136 on the Peltier element 124.

The mounting member 130, such as an L-shaped carrier, is provided on the Peltier element 124. The mounting member 130 has a device mounting portion 130a and a lens holding portion 130b. The mounting member 136, such as a chip carrier, is provided on the device mounting portion 130a. The semiconductor light-emitting element 134 is provided on a mounting face 136a of the device mounting member 136. The following can be taken as illustrations of the semiconductor light-emitting element 134: semiconductor laser elements (e.g., Fabry-Perot type semiconductor laser elements and DFB type semiconductor laser elements), semiconductor laser elements having modulators, and semiconductor optical amplifiers, which are not limited thereto. The semiconductor light-emitting element 134 has a semiconductor light-emitting layer disposed between P- and N-type cladding layers. On the mounting face 136a, a temperature sensing element 135, such as thermistor, is disposed adjacent to the semiconductor light-emitting element 134.

The component mounting member 132 is provided on the device mounting portion 130a. The component mounting member 132 has a mounting face 132a. A semiconductor element 142 is provided on the mounting face 132a. The semiconductor element 142 generates a single-ended driving signal for the semiconductor light-emitting element 134.

A mounting member 128 is provided on the device mounting member 136. On the main face of the mounting member 128, a photodetector 144 is mounted so as to monitor light from the semiconductor light-emitting element 134. This mounting allows the optically coupling of the photodetector 144 to the semiconductor light-emitting element 134. A semiconductor light-receiving element, such as photodiode, may be taken as an example of the photodetector 144.

Figure 8:
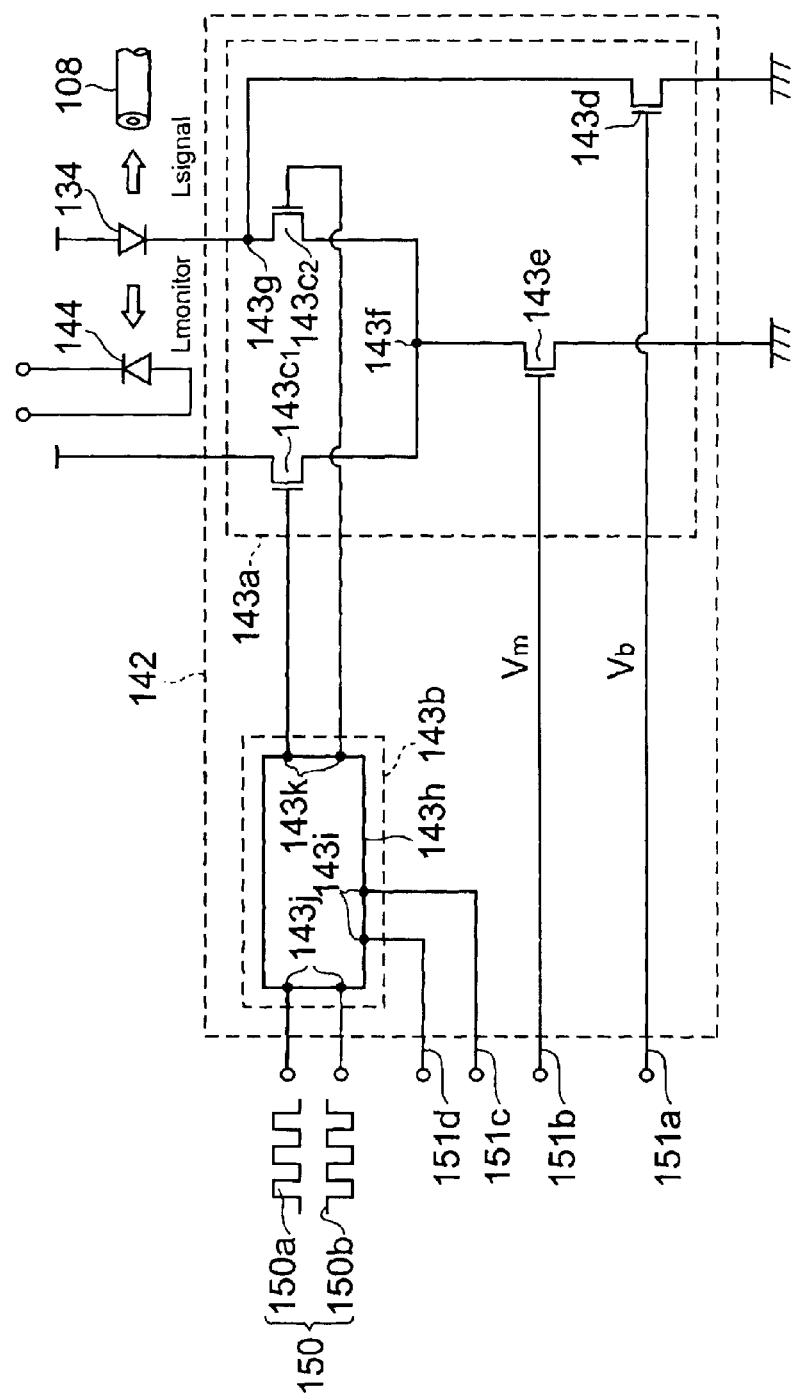
FIG. 8 is a circuit diagram showing an example of circuits integrated in a semiconductor element.

FIG. 8 is a circuit diagram showing an example of a circuit integrated in the semiconductor element 142. Referring to FIG. 8, the semiconductor element 142 comprises a driving circuit unit 143a and a signal processing circuit unit 143b. Although the driving circuit unit 143a and signal processing circuit unit 143b are integrated to form a single semiconductor integrated circuit in this embodiment, they may be configured as separated semiconductor elements.

The driving circuit unit 143a comprises a pair of transistors $143c_1$ and $143c_2$ for driving, a transistor 143d for providing a bias current, and a transistor 143d for providing a modulation current. The pair of transistors $143c_1$ and $43c_2$ are provided so as to constitute a differential pair. In each of the transistors $143c_1$ and $143c_2$, one current terminal (source) is connected to a common node 143f. The other current terminal (drain) of the transistor 143c is connected to a power line. The other current terminal (drain) of the transistor 143d is connected to one electrode of the anode and cathode (cathode is shown in the drawing) of the semiconductor light-emitting element 134 at a node 143g. One current terminal (drain) of the transistor $143c_2$ is connected to the node 143g, whereas the other current terminal is connected to a grounding potential line. One current terminal (drain) of the transistor 143e is connected to the common node 143f, whereas the other current terminal is connected to a grounding potential line.

The signal processing circuit unit 143b includes a signal amplifying portion 143h. The signal amplifying portion 143h comprises terminals 143i for receiving control signals, a pair of inputs 143j for receiving differential signals 150, and a pair of outputs 143k for providing an amplified version of the differential signal. The outputs 143k are connected to control terminals (gates) of the differential paired transistors $143c_1$ and $143c_2$, respectively. The semiconductor element 142 receives a number of control signals at control input terminals 151a to 151d. The terminal 151a receives a signal $V_b$ for controlling the bias current, whereas the terminal 151b receives a signal $V_m$ for controlling the modulation current. The terminal 151a is connected to the control terminal of the transistor 143d. The terminal 151b is connected to the control terminal of the transistor 143e. The semiconductor element 142 receives control signals $V_{x1}$ and $V_{x2}$ at terminals 151c and 151d, respectively. These signals are supplied to the inputs 143i of the signal amplifying portion. The control signals $V_{x1}$ and $V_{x2}$ are analog signals, and are utilized for controlling cross points in optical output waveforms.

The semiconductor light-emitting element 134 is driven by the semiconductor element 142 to provide the optical fiber 18 with light $L_{signal}$ and to provide the photodetector 144 with light $L_{monitor}$.

Referring to FIGS. 6 and 7, lead terminals 104c ($104c_1$, $104c_2$, $104c_3$) are provided in the second to fourth walls 105c to 105e in the optical communication module 100. The second wall 105c is provided with a group of lead terminals $104c_1$ extending in a direction intersecting with a predetermined axis. The third wall 105d is provided with another group of lead terminals $104c_2$ extending in another direction intersecting the predetermined axis. The fourth wall 105e is provided with still another group of lead terminals $104c_3$ extending in the predetermined axial direction.

The lead terminals $104c_3$ in the group are utilized for receiving the differential signal 150 for driving the semiconductor light-emitting element 134. The lead terminals $104c_3$ are constituted by a lead terminal 152a utilized for introducing one signal 150a of the differential pair signals 150, a lead terminal 152b for introducing the other signal 150b of the differential pair signals 150, lead terminals 152c and 152d are arranged between the lead terminal 152a and lead terminals 152d and 152e. The lead terminals 152c, 152d, and 152e are connected to a reference potential line, such as a grounding potential line, within the optical communication module 100a. This terminal arrangement allows the group of lead terminals $104c_3$ to connect with the semiconductor element 142 by way of coplanar transmission lines. The coplanar transmission lines are provided on a wiring member 154. The lead terminals $104c_3$ of this group are utilized only for introducing the differential signals 150 into the housing 4. In this embodiment, only five lead terminals are necessary for introducing the differential signals. Therefore, the wall 105e is not required to increase its width in order to arrange these lead terminals thereon, and thus the width of the optical communication module can be made smaller.

The groups of lead terminals $104c_1$ and $104c_2$ are utilized for providing power terminals and input/output terminals for signals for controlling the semiconductor element 142 and monitoring the semiconductor light-emitting element. Each of the walls 105c and 105d has a width greater than that of the wall 105e, whereby the walls 105c and 105d each can be provided with a greater number of lead terminals. Lead terminals for receiving these signals can be selected from the groups of lead terminals $104c_1$ and $104c_2$. These connections are carried out by way of wiring members 155a and 155b disposed adjacent to the second and third walls 105c and 105d, respectively.

Figure 9:
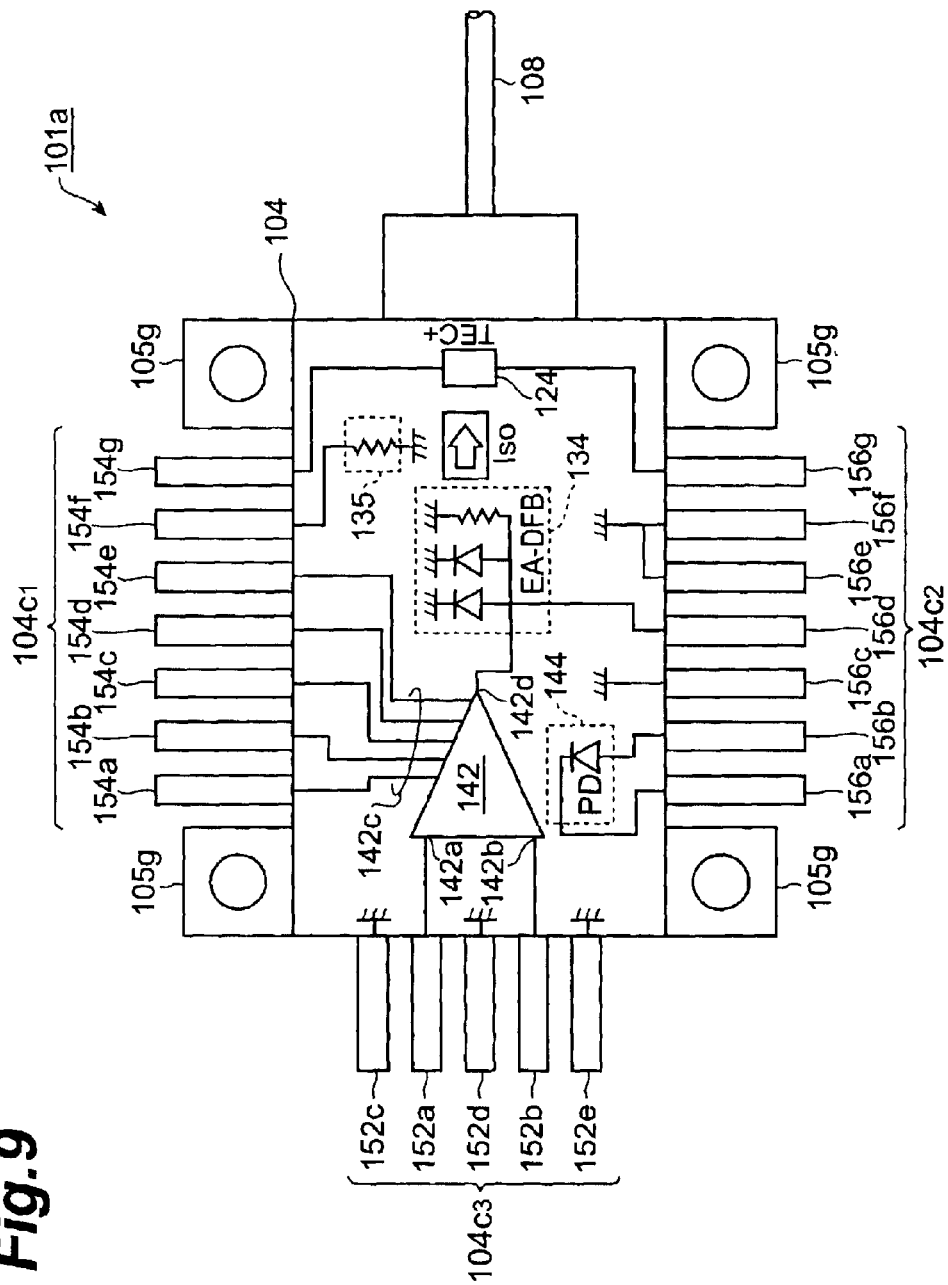
FIG. 9 is a schematic diagram showing an example of the arrangement of lead terminals in a communication module.

FIG. 9 is a schematic view showing an example of assignments of lead terminals in the optical communication module 100a. In this optical communication module 100a, an optical integrated element including a DFB semiconductor laser and an optical modulator therein is used as the semiconductor light-emitting element 134. The group of lead terminals $104c_3$ are utilized only for supplying the differential signals 150 to the signal input terminals 142a, 142b of the semiconductor element 142. This differential signals 150 are processed in the semiconductor element 142, and is supplied to the optical modulator by way of the output terminal 142d.

The control and power terminals 142c of the semiconductor element 142 are connected to lead terminals 154a to 154e in the group of lead terminals $104c_1$. These control terminals are provided for analog signals $V_m$, $V_b$, $V_{x1}$, $V_{x2}$, whereas the power terminal is provided for Vss power of the circuit for receiving these analog signals. One terminal of the temperature sensing element 135 is connected to a lead terminal 154f in the group of the lead terminals $104c_1$. One of the anode and cathode of the Peltier element 124 is connected to a lead terminal 154g in the group of lead terminals $104c_1$.

The anode and cathode of the photodetector 144 are connected to lead terminals 156a and 156b in the group of lead terminals $104c_2$. The power to the DFB semiconductor laser in the semiconductor light-emitting element 134 is connected to a lead terminal 156d in the group of lead terminals $104c_2$. The other of the anode and cathode of the Peltier element 124 is connected to a lead terminal 156g in the group of lead terminals $104c_2$. Lead terminals 156c, 156e, and 156f in the group of lead terminals $104c_2$ are connected to a reference potential line, such as a grounding potential line, within the optical communication module 100a.

In the optical communication module 100a, the lead terminals of the optical communication module are categorized into three groups. The lead terminals in the first group are utilized for introducing high-frequency signals for driving the semiconductor light-emitting element. The lead terminals in the second and third groups are utilized for introducing a power and signals other than the high-frequency signals. In particular, in the optical communication module 100a, the analog control signals ($V_m$, $V_b$, $V_1$, $V_{x2}$) and power (Vss) of the semiconductor element 142 are fed by way of the second group of lead terminals. Therefore, the mutual interference between analog and high-frequency signals can be reduced. The lead terminals in third group are utilized for feeding power, signals other than high-frequency signals and feeding input and output signals other than the power and control signals for the semiconductor element 142. Therefore, signals on the lead terminals in the third wall can be separated from signals on the lead terminals in the second wall.

Figure 10A:
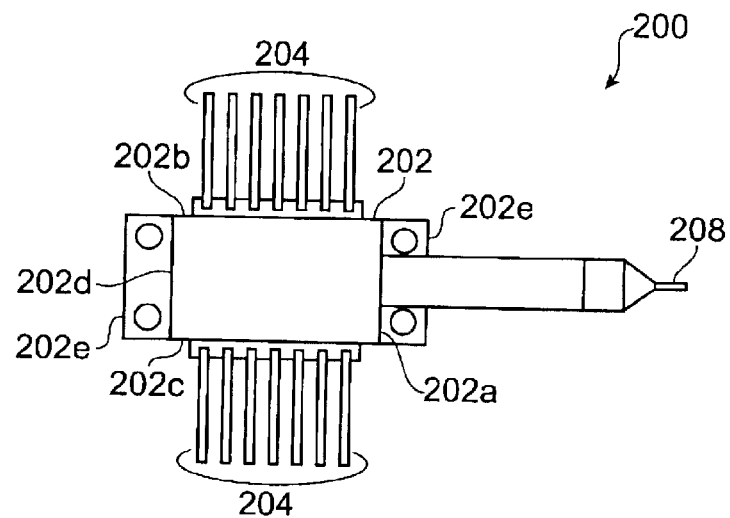
FIG. 10A is a plan view of an optical communication module for comparison.
Figure 10B:
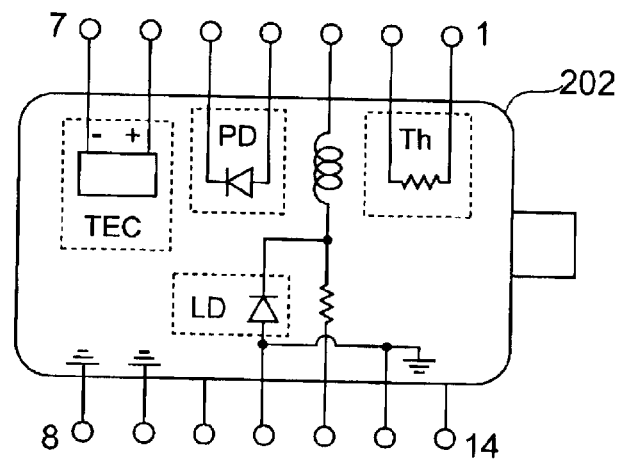
FIG. 10B is a schematic diagram showing the arrangement of lead terminals in the optical communication module for comparison.

FIG. 10A is a plan view of an optical communication module 200 for comparison, whereas FIG. 10B is a schematic diagram showing the arrangement of lead terminals in the optical communication module 200. The optical communication module 200 comprises a housing 202. An optical fiber 208 extends from the housing 202 in a predetermined axial direction. The housing 202 comprises a wall 202a in which an optical fiber supporting portion for supporting the optical fiber 208 is provided, walls 202b and 202c extending in the predetermined axial direction, a wall 202d opposed to the wall 202a, and a plurality of flanges 202e. Lead terminals 204 are provided on the walls 202b and 202c alone, and extend in a direction intersecting with the predetermined axis. The flanges 202e are provided in the walls 202a and 202d so as to be oriented in the predetermined axial direction.

The optical communication module 200 includes therein a semiconductor laser element LD, a Peltier device TEC, a monitor light-receiving device PD, and a thermistor Th. Terminals of these devices are connected to lead terminals provided in one wall as shown in FIG. 10B.

If a semiconductor element for driving the semiconductor laser element is added to the optical communication module 200, control signals are added to this semiconductor device by way of lead terminals in any of two walls. This further complicates the assignments of lead terminals.

Third Embodiment

Figure 11:
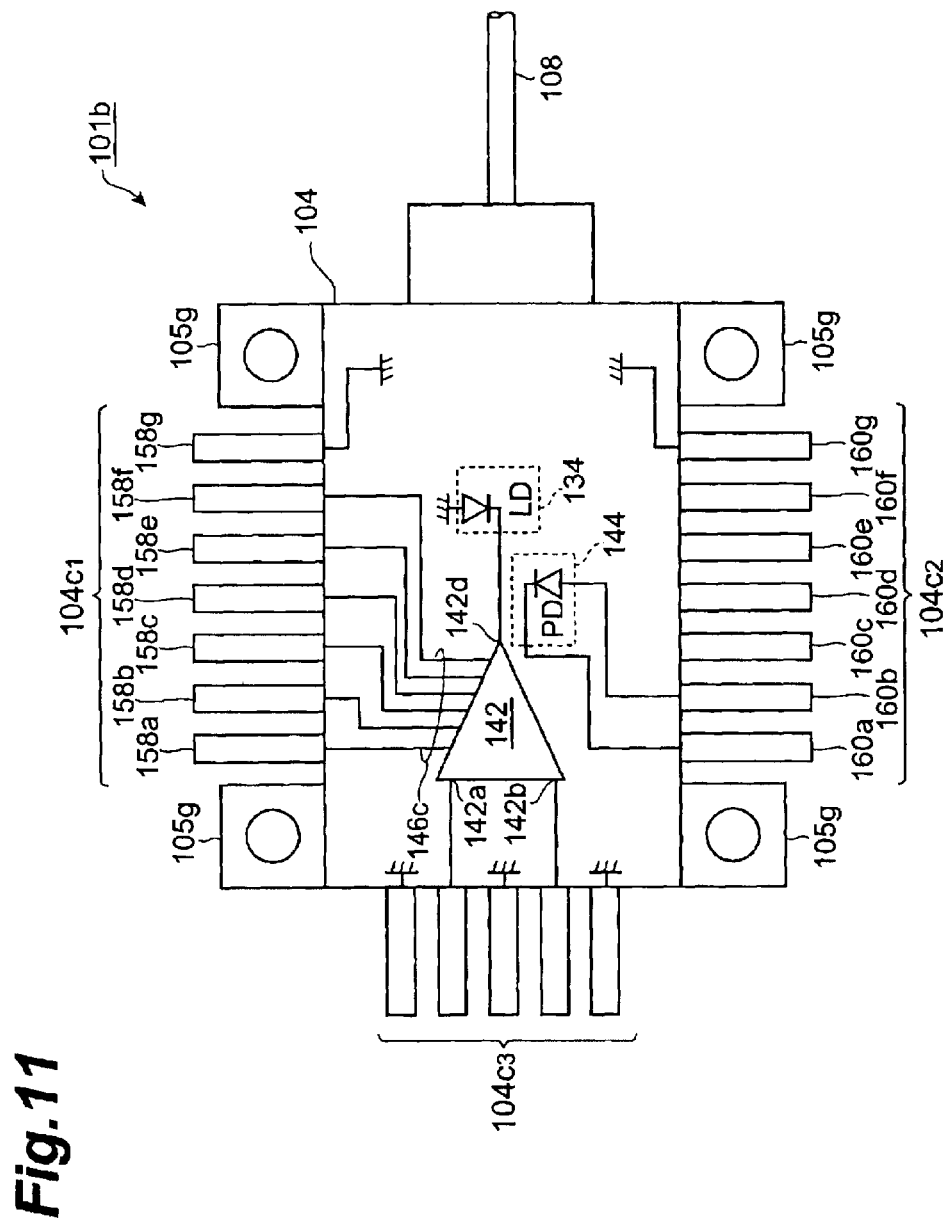
FIG. 11 is a schematic diagram showing an example of the arrangement of lead terminals in another optical communication module.

FIG. 11 is a schematic diagram showing an example of assignments of lead terminals in an optical communication module 100b. This optical communication module 100b comprises a semiconductor light-emitting element 134, a semiconductor element 142, and a photodetector 144. In the optical communication module 100b, a semiconductor laser element is used as a semiconductor light-emitting element 134. As in the first embodiment, the lead terminals $104c_3$ in the group are utilized only for supplying differential signals 150 to signal input terminals 142a and 142b of the semiconductor element 142. The differential signals 150 are processed by the semiconductor element 142 so as to form a single-ended signal to be supplied to the semiconductor laser element by way of the output terminal 142d.

Control and power terminals 142c of the semiconductor element 142 are connected to lead terminals 158a to 158e in the group of lead terminals $104c_1$. In the group of lead terminals $104c_1$, a lead terminal 158g is not provided for receiving signals, but is connected to a reference potential line, such as a grounding potential line, within the optical communication module 100b.

The anode and cathode of the photodetector 144 are connected to lead terminals 160a and 160b in the group of lead terminals $104c_2$. In the group of lead terminals $104c_2$, although lead terminals 160c to 160f are not provided for receiving signals, a lead terminal 160g is connected to a reference potential line, such as a grounding potential line, within the optical communication module 100b.

As with the optical communication module 100a, the optical communication module 100b categorizes its lead terminals into three groups. The lead terminals in first group are utilized for feeding high-frequency signals for driving the semiconductor light-emitting element. The lead terminals in second and third groups are utilized for feeding power and signals other than the high-frequency signals. In particular, in the optical communication module 100b, the control signals ($V_m$, $V_b$, $V_{x1}$, $V_{x2}$) and power (Vss) for the driving semiconductor element 142 are fed by way of the second group of lead terminals. The lead terminals in the third group are utilized for input signals and output signals and power other than high-frequency signals and other than the control signals and power for the semiconductor element. Vss and signals concerning the photodetector 144 are supplied to lead terminals on respective walls separated from each other, thereby restraining the power and small monitor currents from interfering with each other.

Fourth Embodiment

Figure 12:
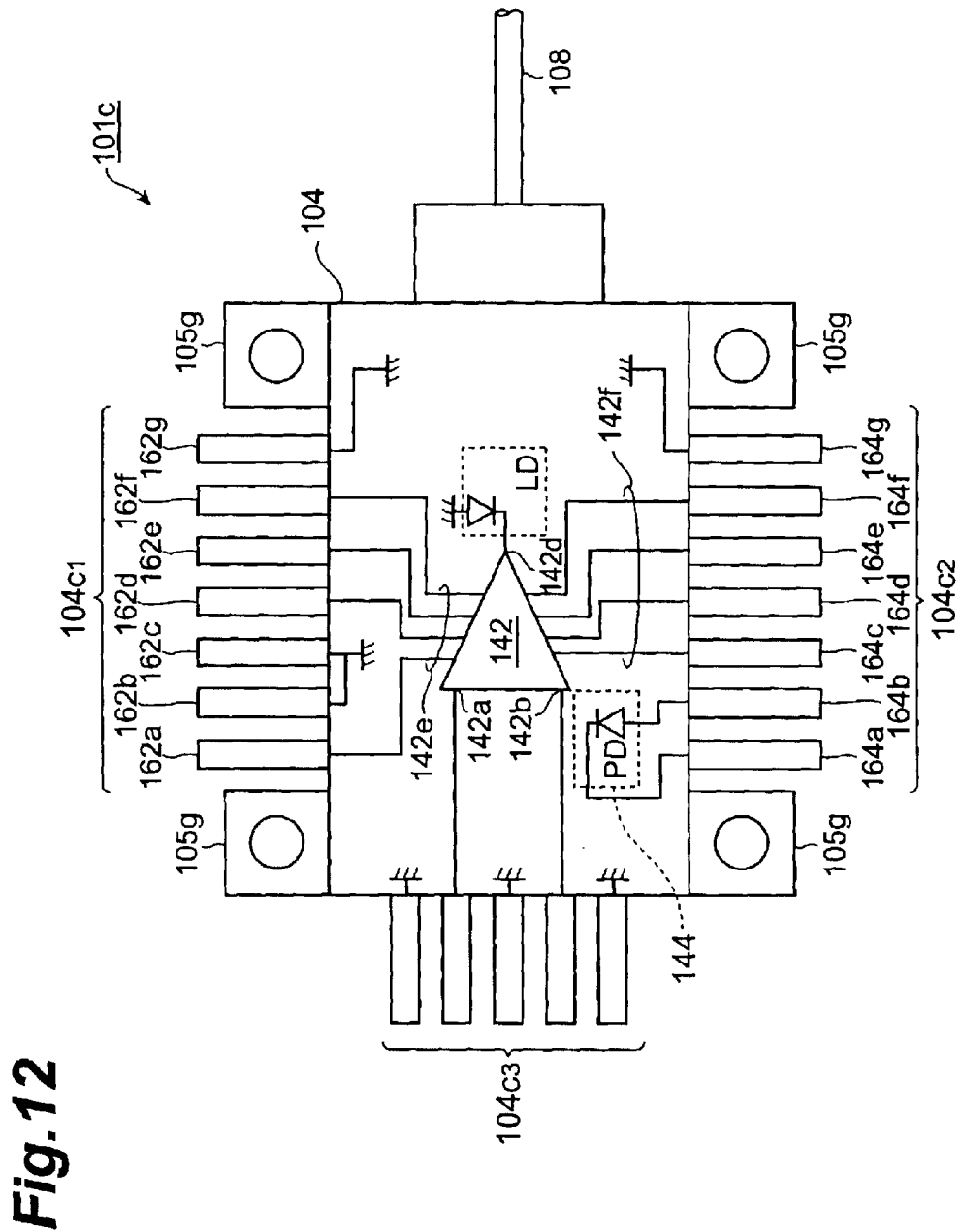
FIG. 12 is a schematic diagram showing an example of the lead terminal arrangement in still another optical communication module.

FIG. 12 is a schematic diagram showing an example of lead terminal assignments in an optical communication module 100c. This optical communication module 100c comprises a semiconductor light-emitting device 134, a semiconductor device 142, and a photodetector 144.

Control and power terminals 142e of the semiconductor device 142 are connected not only to lead terminals 162a, 162c to 162f in the group of lead terminals $104c_1$, but also to lead terminals 162c to 162f in the group of lead terminals $104c_2$. Signal $V_{ref1}$ for stably operating the semiconductor device is provided on the lead terminal 162a, whereas signal $V_{bmon}$ for monitoring the bias current, signal $V_b$, and signal Vss are assigned to the lead terminals 162d to 162f, respectively. Signal $V_{ref2}$ for stably operating the semiconductor device, signal $V_m$, signal $V_{mmon}$ for monitoring the modulation current, and Vss are provided to the lead terminals 164c to 164f, respectively. These are analog signals, among which the signals $V_{ref1}$, $V_{ref2}$, $V_b$, $V_m$ are fed into the semiconductor device 142, whereas the signals $V_{bmon}$ and $V_{mmon}$ are outputted from the semiconductor device 142. The signals ($V_m$ and $V_{mmon}$) concerning the modulation current are assigned to lead terminals in one wall and the signals ($V_b$ and $V_{bmon}$) concerning the bias current are assigned to lead terminals in another wall, thereby suppressing the interference between these signals within the optical module. In the group of lead terminals $104c_1$, lead terminals 162b, 162c, 162g are connected to a reference potential line, such as a grounding potential line, within the optical communication module 100c.

The anode and cathode of the photodetector 144 are connected to lead terminals 164a and 164b in the group of lead terminals $104c_2$. A lead terminal 164g in the group of lead terminals $104c_2$ is connected to a reference potential line, such as a grounding potential line, within the optical communication module 100c.

As with the optical communication module 100a, the lead terminals in the optical communication module 100c is categorized into three groups. The lead terminals in the first group are utilized for the input of high-frequency signals for driving the semiconductor light-emitting device. The lead terminals in the second and third groups are utilized for the input of signals other than the high-frequency signals, and power. Namely, since the high-frequency signals are inputted only by way of lead terminals arranged in one wall of the optical communication module 100c, lead terminals positioned in other two walls can be utilized for the input and/or output of other signal lines. As a consequence, restrictions on the pin arrangement are loosened. This makes it more flexible to design a substrate on which the optical communication module 100c is mounted.

Fifth Embodiment

Figure 13:
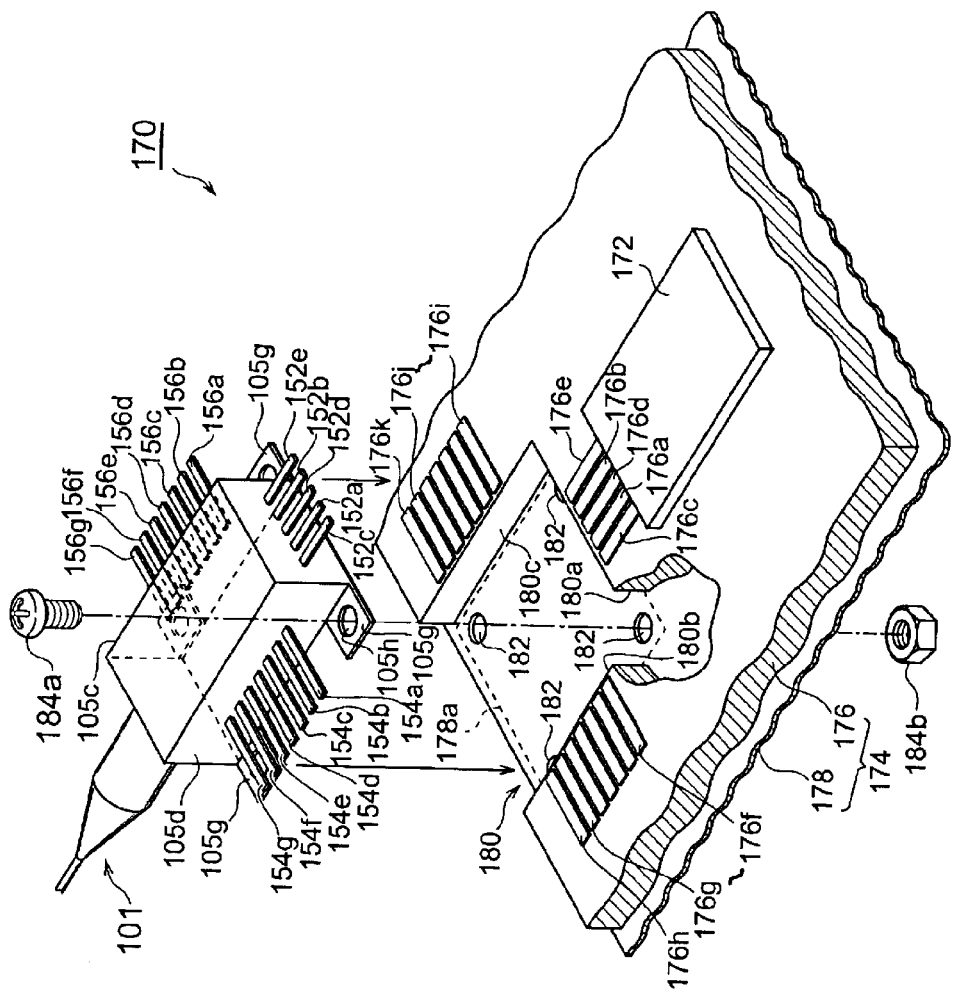
FIG. 13 is a view showing components constituting an optical communication module product.

FIG. 13 is a view showing components constituting an optical communication module product. This optical communication module product 170 comprises an optical communication module 100, an electronic component 172, and a substrate 174. The electronic component 172 generates differential signals (150 in FIG. 6) for driving a semiconductor light-emitting device (134 in FIG. 5). The substrate 174 includes a wiring member 176 and a mounting member 178. The mounting member 178 is mounted with the optical communication module 100 and the wiring member 176.

Figure 14:
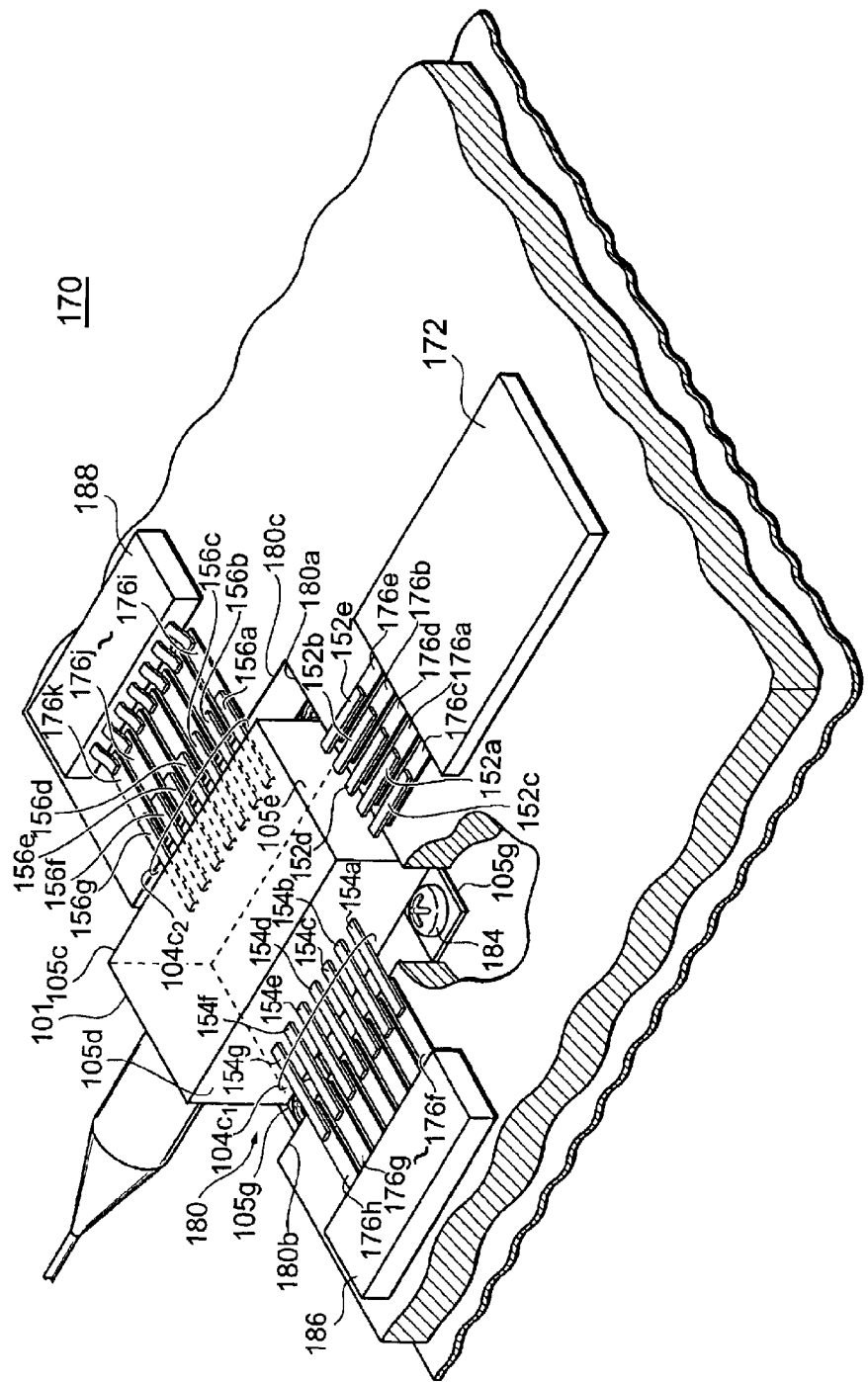
FIG. 14 is a perspective view showing the optical communication module product.

FIG. 14 is a perspective view showing the optical communication module product. Referring to FIGS. 13 and 14, the wiring member 176 has an opening, shaped like cutout 180, provided so as to receive the optical communication module 100 therein. The cutout 180 is provided such that the wiring member 176 is recessed from one side thereof, whereby the mounting member 178 appears at the cutout 180. The cutout 180 provides an area 178a, on the mounting member 178, for mounting the optical communication module 100. Within this area 178a, the mounting member 178 has attaching portions 182 aligned with a plurality of flanges 105g of the optical communication module 100, respectively. The attaching portions 182 may be attachment holes penetrating through the mounting member 178 from one side to the other side. Each flange 105g has an attaching portion 105h, such as an attachment hole penetrating therethrough from one side to the other side thereof. The optical communication module 100 is attached to the mounting member 178 with the aid of the attachments 182, flanges 105g, and fastening members 184 (184a, 184b). By way of example, the attachment holes 105h are aligned with their corresponding attachment holes of the attachments 82, and then fastening members 184a, such as bolts, are inserted into these attachment holes and are secured with fastening members 184b, such as nuts.

The cutout 180 has sides 180a, 180b, 180c facing three walls of the optical communication module 1, respectively. The side 180a is provided so as to face the fourth wall 105e. The side 180b is provided so as to face the third wall 105d. The side 180c is provided so as to face the second wall 105c. The optical communication module 100 is disposed between the sides 180b and 180c. In the optical communication module product 170, the distance between the side 180a and the wall 105e of the optical communication module 100 is smaller than the distance between the side 180c and the wall 105c of the optical communication module 100 and is also smaller than the distance between the wall 105d and the side 180b because flanges 105g of the optical communication module 100 are positioned between the wall 105c and side 180c and between the wall 105d and the side 180b.

Wiring member 176 has wiring layers 176a and 176b for connecting the electronic component 172 to lead terminals 152a and 152b of the optical communication module 100. The electronic component 172 is provided on the wiring member 176 so as to face the back wall 105e of the optical communication module 100. This configuration of the wiring member 176 can shorten the wiring length. Each of wiring layers 176a to 176e has one end connected to the electronic component 172 and the other end positioned in an area adjacent the side of the fourth wall. The wiring member 176 has the wiring layers 176c to 176e connected to lead terminals 152c to 152e of the optical communication module 100, respectively. These wiring layers 176a to 176e are connected to a reference potential line, such as a grounding potential line. The wiring layers 176c to 176e extend in a predetermined axial direction (a direction in which the optical fiber extends).

The wiring member 176 has wiring layers 176f to 176h thereon, and wiring layers 176f to 176h are connected to lead terminals 154c to 154g of the optical communication module 100, respectively. Each of the wiring layers 176f to 176h has one end positioned in an area, facing the side 180b, of the wiring member 176, and extends in a direction intersecting the predetermined axis. The wiring member 176 has wiring layers 176j to 176k thereon, and the wiring layers 176j to 176k are connected to lead terminals 156c to 164g in the optical communication module 100. Each of the wiring layers 176j to 176k has one end positioned in an area of the wiring member 176 facing the side 180c, and extends in a direction intersecting the predetermined axis.

According to this optical communication module product 170, the lead terminals 152a and 152b provided in the fourth wall 105e are connected to the differential signal terminals of the semiconductor device 142 in the optical communication module 100, whereas the lead terminals 154a to 154g and 156a to 156g of the walls 105c and 105d are connected to the control and power terminals of the semiconductor device 142. As a consequence, in the wiring member 178, the wiring layers 176f to 176h connected to the control and power terminals of the semiconductor device 142 can be separated from the wiring layers 176a and 176b for propagating high-frequency signals.

Referring to FIG. 14, the wiring member 76 further comprises electronic devices 186 and 188 mounted thereon. In the optical communication module 100a in accordance with the first embodiment (as in the optical communication module 100b in accordance with the second embodiment), wires associated with the semiconductor device 142 are connected to the lead terminals 154a to 154e arranged at only one wall, e.g., the wall 105d, of the walls (lead terminals 158a to 158e in the optical communication module 100b). Since the semiconductor device 142 is susceptible to power variations, the inventors think it preferable that the electronic device 186 and signal lines connected to the semiconductor device 142 are arranged such that they do not suffer power variations. For attaining a configuration in which they can resist power fluctuations, the electronic device 186 for controlling the semiconductor device 142 is disposed in proximity to the wall 105d on the mounting substrate 176. According to the inventors' findings, providing electronic devices for controlling the semiconductor device 142 in one area prepared on the wiring member 176 is effective in improving their resistance to power fluctuations.

In the configuration as shown in FIG. 14, the electronic device 188 is provided in proximity to the wall 105c and on the mounting substrate 176. The electronic device 188 may include circuits less susceptible to power voltage variations, such as a control circuit for a monitor light-receiving device, a control circuit for a Peltier device, and a DC power circuit for a semiconductor light-emitting device.

Namely, signal lines to be connected to lead terminals in the three walls of the optical communication module are divided into a number of groups depending on their susceptibilities to electrical noise, and an electronic device for each group is arranged to face the different wall thereof when mounting the optical communication module on the substrate. According to this arrangement, the electronic device 186 including a control circuit for the optical communication module 100, another electronic device 188, and the electronic device 172 concerning high-speed signals, e.g., of 10 Gbps, can be separated from each other so as to prevent mutual noise and interference therebetween from occurring.

Figure 15A:
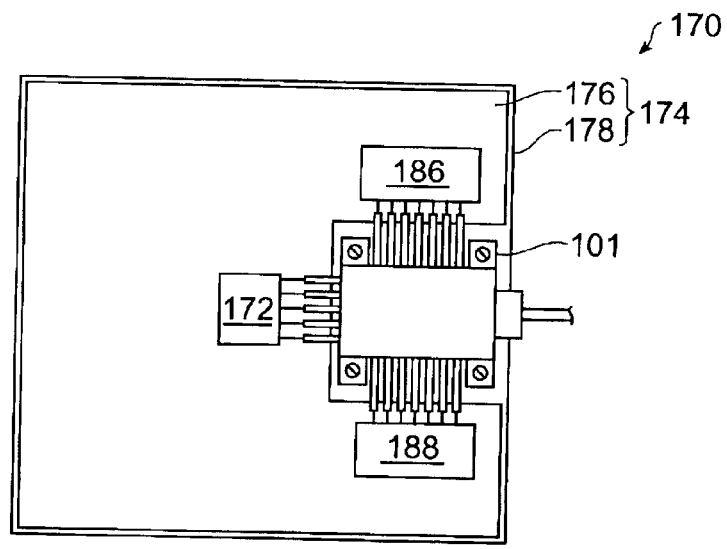
FIGS. 15A and 15B each is a schematic diagram for explaining the relationship between the positions of flanges and the length of a wiring for high-frequency signals in the optical communication module.
Figure 15B:
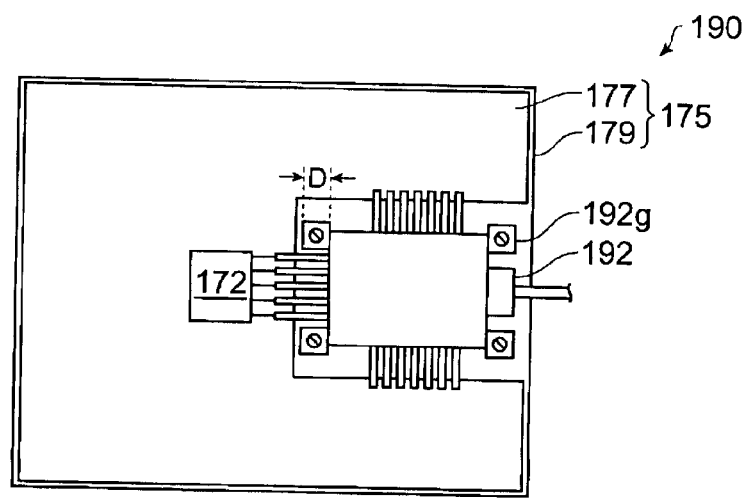
Figure 16:
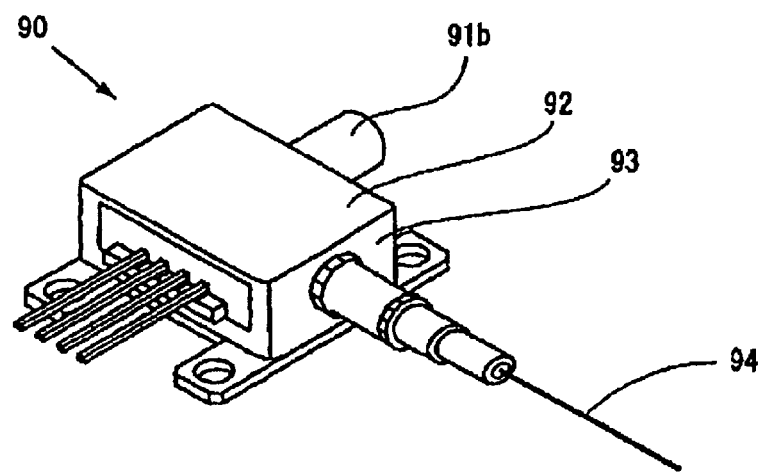
FIG. 16 is a perspective view of an optical transmission module for technical studies.
Figure 17:
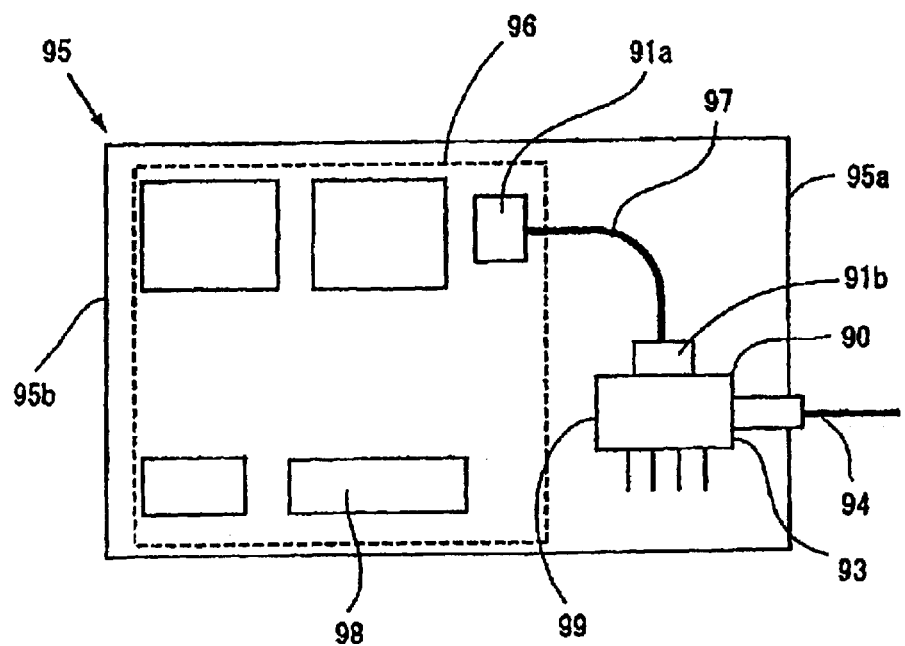
FIG. 17 is a schematic diagram of a circuit board mounted with the optical transmission module for technical studies.

FIGS. 15A and 15B each is a schematic diagram for explaining relationship between the positions of flanges and the length of wirings for high-frequency signals in the optical communication module 100. FIG. 15A illustrates the optical communication module product 170 shown in FIG. 14. FIG. 15B illustrates an optical communication module product 190 for comparison. The optical communication module product 190 comprises an optical communication module 192, an electronic component 172, and a substrate 175. The substrate 175 comprises a wiring member 177 and a mounting member 179. The mounting member 179 is mounted with the optical communication module 192 and wiring member 177. The first and fourth walls of the optical communication module 192 are provided with flanges 192g.

Therefore, the length of the wirings connecting high-frequency signal terminals to the semiconductor device 172 is longer by length D than that in the optical communication module product 170 shown in FIG. 15A.

In the embodiments of the invention explained in the foregoing, five to seven lead terminals are provided in each of the second and third walls, whereas five lead terminals are provided in the fourth wall. Thus, the optical communication module has 15 to 19 lead terminals in total.

According to the foregoing embodiments of the invention, control terminals are arranged in the second and third walls of the optical communication module, whereas input lead terminals for high-frequency signals are arranged in the fourth wall, whereby signals can be separated from each other. In agreement therewith, the fourth wall in the optical communication module fronts on the side of a wiring member that signal lines for high-frequency signals reach in the optical communication module product. Therefore, in both of the optical communication module and wiring members, it becomes easier to electrically separate high-frequency signals and control signals from each other, thereby reducing the interference between these signals.

Also, in the optical communication module having control terminals for the semiconductor device arranged in one wall alone, in agreement therewith, the fourth wall in the optical communication module fronts on the side of a wiring member that signal lines for high-frequency signals reach in the optical communication module product. Therefore, it becomes flexible to design the arrangement of devices and wiring patterns on wiring members.

When flanges of the optical communication module are arranged in the second and third walls, the substrate is not required to have an area thereon, prepared for flanges, adjacent to the fourth wall of the optical communication module. Therefore, without any restrictions from the arrangement of flanges, high-frequency signal lines of the wiring members can be connected to high-frequency signal terminals of the optical communication module.

The inventors have been engaged in developing optical communication modules for transmitting high-speed signals. The inventors have been carrying out studies on the optical communication modules that process such high-speed signals. Such optical communication modules are now demanded to process high-speed signals having an optical signal transmission rate of about 10 Gbps.

For satisfying this demand, the inventors think it necessary to incorporate an integrated circuit device for driving a semiconductor laser into an optical communication module. The optical communication module has a structure capable of receiving electric signals supplied to the integrated circuit device. These electric signals include not only high-frequency signals for supplying electric driving power to the semiconductor laser, but also control signals for the integrated circuit device. In addition, lead terminals of the optical communication module are utilized as a power terminal for driving the semiconductor laser, and a power and a monitor current terminal for a monitor light-receiving device, for example. However, the inventors' detailed studies have revealed it necessary to separately handle high-frequency signals and other signals, such as control signals when the transmission rate of optical signals is higher. If lead terminals for high-frequency signals are located near lead terminals for the other signals, control signals may interfere with high-frequency signals. Also, interference may occur in wiring layers on the substrate mounted with this optical communication module. Further, in order to prevent control and high-frequency signals from interfering with each other, it is necessary that the control signal lines do not intersect the high-frequency signal lines within the optical communication module.

According to the configurations described in the embodiments, optical communication modules and optical communication module products each having a structure which can reduce the interference between high-frequency signals and other signals are provided.

The principle of the present invention has been illustrated and described in the preferred embodiments thereof, and it is apparent to those skilled in the art that the present invention can be modified in arrangement and in detail without departing from the principle described above. For example, bipolar transistors can also be used as transistors without being restricted to field-effect transistors. Although a butterfly type package is explained by way of example as the housing, it is not restricted to the specific configuration disclosed in the embodiments. Further, the semiconductor light-emitting device is not restricted to the specific configuration disclosed in the embodiments. Accordingly, the inventor claims rights over all modifications and changes falling within the scope of the spirit of the invention and within the scope of the claims which follow.

What is claimed is:

1. An optical transmission module comprising:
    a semiconductor laser element for emitting light;
    a semiconductor circuit element for driving said semiconductor laser element; said semiconductor circuit element receiving a positive-phase signal including a high-frequency component and a complementary negative-phase signal, converting said signals into a single-phase signal, and outputting thus obtained signal to said semiconductor laser element;
    a package for containing said semiconductor laser element and said semiconductor circuit element therein; said package having an optical fiber supporting face and an back face, wherein said optical fiber supporting face supports an optical fiber for transmitting said light emitted from said semiconductor laser element and an back face is opposed to said optical fiber supporting face;
    a first lead pin, provided in said back face of said package, for providing said semiconductor circuit element with said positive-phase signal; and
    a second lead pin, provided in said back face of said package, for providing said semiconductor circuit element with said negative-phase signal;
    wherein said first and second lead pins are provided so as to penetrate through said back face.

2. An optical transmission module according to claim 1, further comprising a plurality of grounding lead pins provided along a plane parallel to a bottom face of said package so as to penetrate through said back face substantially perpendicular thereto, each of said first and second lead pins being arranged between said grounding lead pins;
    wherein said first and second lead pins are provided substantially perpendicular to said back face on said plane.

3. An optical transmission module according to claim 2, wherein said first lead pin, said second lead pin, and said grounding lead pins constitute coplanar type transmission lines within said package.

4. An optical communication module comprising:
    a housing having first to fourth walls, wherein said first wall is provided with an optical fiber accommodating portion extending in a direction of the predetermined axis, wherein said second and third walls each extends in a direction of said predetermined axis and has a plurality of lead terminals, and wherein said fourth wall is provided opposite from said first wall and has a plurality of lead terminals;
    a semiconductor device having a first group of input terminals for receiving differential signals, an output terminal for providing a driving signal generated from said differential signals, and a second group of a plurality of terminals different from said input and output terminals; and
    a semiconductor light-emitting device connected to said output terminal of said semiconductor device;
    wherein said plurality of lead terminals in said fourth wall consist of a first lead terminal, a second lead terminal, and third lead terminals, said first lead terminal being connected to one of said input terminals of said semiconductor device, said first lead terminal being provided for receiving one of said differential signals, said second lead terminal being connected to the other of said input terminals of said semiconductor device, said second lead terminal being provided for receiving the other of said differential signals, and said third lead terminals being connected to a reference potential line, each of said first and second lead terminals being arranged between said third lead terminals; and
    wherein said plurality of terminals in said second group of said semiconductor device are connected to said plurality of lead terminals in said second and third walls.

5. An optical communication module according to claim 4, wherein the number of said plurality of lead terminals in said fourth wall is 5.

6. An optical communication module according to claim 4, wherein said second group of terminals in said semiconductor device are connected to said lead terminals in said second wall.

7. An optical communication module according to claim 6, wherein said semiconductor light-emitting device includes a light-emitting device portion for generating light, and a semiconductor modulating device portion for modulating said light from said light-emitting device portion;
    wherein a terminal of said light-emitting device portion is connected to said lead terminal in said third wall.

8. An optical communication module according to claim 6, wherein said semiconductor light-emitting device includes a semiconductor laser element; and
    wherein one of an anode and a cathode of said semiconductor laser element is connected to said output terminal of said semiconductor device, whereas the other of said anode and cathode of said semiconductor laser element is connected to a reference potential line.

9. An optical communication module according to claim 6, wherein said second group of terminals include a terminal to which a analog signal is applied, and a power terminal for said semiconductor device.

10. An optical communication module according to claim 6, further comprising coplanar type transmission lines provided between said fourth wall and said semiconductor device;
    wherein said semiconductor device is connected to said plurality of lead terminals in said fourth wall by way of said coplanar type transmission lines.

11. An optical communication module according to claim 6, further comprising a plurality of flanges provided in walls different from said fourth wall.

12. An optical transmission module comprising:
a semiconductor circuit element having first and second input terminals for receiving a signal and a complementary signal each including a high-frequency component, respectively, and an output terminal for providing a single-phase signal generated from said signals;
a semiconductor light-emitting device optically coupled to an optical fiber, said semiconductor light-emitting device being connected to said output terminal of said semiconductor circuit element;
a housing having an optical fiber supporting face provided so as to support said optical fiber and an back face opposite from said optical fiber supporting face, said housing containing said semiconductor light-emitting device and said semiconductor circuit element;
a first lead pin provided in said back face, said first lead pin being connected to said first input terminal of said semiconductor circuit element; and
a second lead pin provided in said back face, said second lead pin being connected to said second input terminal of said semiconductor circuit element.

13. An optical communication module product comprising:
said optical communication module according to claim 4;
an electronic component for generating differential signals for driving said semiconductor light-emitting device; and
a substrate comprising a wiring member and a mounting member, said wiring member having a wiring layer for connecting said electronic component to said first and second lead terminals of said optical communication module, and said mounting member provided for mounting said optical communication module and said wiring member;
wherein said wiring member has an opening provided so as to be able to receive said optical communication module therein, said opening having a side provided so as to face said fourth wall.

14. An optical communication module product comprising:
said optical communication module according to claim 5;
an electronic component for generating differential signals for driving said semiconductor light-emitting device; and
a substrate comprising a wiring member and a mounting member, said wiring member having a wiring layer for connecting said electronic component to said first and second lead terminals of said optical communication module, and said mounting member provided for mounting said optical communication module and said wiring member;
wherein said wiring member has an opening provided so as to be able to receive said optical communication module therein, said opening having a side provided so as to face said fourth wall.

15. An optical communication module product comprising:
said optical communication module according to claim 6;
an electronic component for generating differential signals for driving said semiconductor light-emitting device; and
a substrate comprising a wiring member and a mounting member, said wiring member having a wiring layer for connecting said electronic component to said first and second lead terminals of said optical communication module, and said mounting member provided for mounting said optical communication module and said wiring member;
wherein said wiring member has an opening provided so as to be able to receive said optical communication module therein, said opening having a side provided so as to face said fourth wall.

16. An optical communication module product comprising:
said optical communication module according to claim 7;
an electronic component for generating differential signals for driving said semiconductor light-emitting device; and
a substrate comprising a wiring member and a mounting member, said wiring member having a wiring layer for connecting said electronic component to said first and second lead terminals of said optical communication module, and said mounting member provided for mounting said optical communication module and said wiring member;
wherein said wiring member has an opening provided so as to be able to receive said optical communication module therein, said opening having a side provided so as to face said fourth wall.

17. An optical communication module product comprising:
said optical communication module according to claim 8;
an electronic component for generating differential signals for driving said semiconductor light-emitting device; and
a substrate comprising a wiring member and a mounting member, said wiring member having a wiring layer for connecting said electronic component to said first and second lead terminals of said optical communication module, and said mounting member provided for mounting said optical communication module and said wiring member;
wherein said wiring member has an opening provided so as to be able to receive said optical communication module therein, said opening having a side provided so as to face said fourth wall.

18. An optical communication module product comprising:
said optical communication module according to claim 9;
an electronic component for generating differential signals for driving said semiconductor light-emitting device; and
a substrate comprising a wiring member and a mounting member, said wiring member having a wiring layer for connecting said electronic component to said first and second lead terminals of said optical communication module, and said mounting member provided for mounting said optical communication module and said wiring member;
wherein said wiring member has an opening provided so as to be able to receive said optical communication module therein, said opening having a side provided so as to face said fourth wall.

19. An optical communication module product comprising:
said optical communication module according to claim 10;
an electronic component for generating differential signals for driving said semiconductor light-emitting device; and a substrate comprising a wiring member and a mounting member, said wiring member having a wiring layer for connecting said electronic component to said first and second lead terminals of said optical communication module, and said mounting member provided for mounting said optical communication module and said wiring member;

wherein said wiring member has an opening provided so as to be able to receive said optical communication module therein, said opening having a side provided so as to face said fourth wall.

20. An optical communication module product comprising:

said optical communication module according to claim 11;

an electronic component for generating differential signals for driving said semiconductor light-emitting device; and a substrate comprising a wiring member and a mounting member, said wiring member having a wiring layer for connecting said electronic component to said first and second lead terminals of said optical communication module, and said mounting member provided for mounting said optical communication module and said wiring member;

wherein said wiring member has an opening provided so as to be able to receive said optical communication module therein, said opening having a side provided so as to face said fourth wall.

* * * * *